(12) United States Patent
Gangam et al.

(10) Patent No.: US 11,481,350 B1
(45) Date of Patent: Oct. 25, 2022

(54) NETWORK CHIP YIELD IMPROVEMENT ARCHITECTURES AND TECHNIQUES

(71) Applicant: Innovium, Inc., San Jose, CA (US)

(72) Inventors: Srinivas Gangam, Milpitas, CA (US); Ajit Kumar Jain, Milpitas, CA (US); Anurag Kumar Jain, San Jose, CA (US); Avinash Gyanendra Mani, San Jose, CA (US); Mohammad Kamel Issa, Los Altos, CA (US)

(73) Assignee: Innovium, Inc., San Jose, CA (US)

( * ) Notice: Subject to any disclaimer, the term of this patent is extended or adjusted under 35 U.S.C. 154(b) by 0 days.

(21) Appl. No.: 16/940,003

(22) Filed: Jul. 27, 2020

(51) Int. Cl.
  G06F 13/40 (2006.01)
  H03M 9/00 (2006.01)
  G06F 13/42 (2006.01)
(52) U.S. Cl.
  CPC ...... G06F 13/4027 (2013.01); G06F 13/4282 (2013.01); H03M 9/00 (2013.01)
(58) Field of Classification Search
  CPC ... G06F 13/4027; G06F 13/4282; H03M 9/00
  See application file for complete search history.

(56) References Cited

U.S. PATENT DOCUMENTS

| | | | | |
|---|---|---|---|---|
| 7,020,729 | B2 * | 3/2006 | Taborek, Sr. | H04L 12/413 710/305 |
| 2002/0026625 | A1 * | 2/2002 | Kondou | G06F 30/394 716/131 |
| 2004/0212012 | A1 * | 10/2004 | Yamazaki | H01L 27/1214 257/347 |
| 2008/0181203 | A1 * | 7/2008 | Jones | H04J 3/1664 370/353 |
| 2010/0309101 | A1 * | 12/2010 | Kanegae | H01L 51/5228 438/34 |
| 2011/0318609 | A1 * | 12/2011 | Miura | H05K 1/0271 216/13 |
| 2015/0341277 | A1 * | 11/2015 | Gravel | H04L 1/0002 370/468 |
| 2016/0006677 | A1 * | 1/2016 | Lamb | H04L 49/9005 370/412 |
| 2017/0351795 | A1 * | 12/2017 | Ghattas | G06F 30/33 |
| 2019/0020466 | A1 * | 1/2019 | Raymond | H04J 3/0697 |
| 2019/0101952 | A1 * | 4/2019 | Diamond | G06F 1/3243 |

* cited by examiner

*Primary Examiner* — Henry Tsai
*Assistant Examiner* — Aurangzeb Hassan
(74) *Attorney, Agent, or Firm* — Wong & Rees LLP

(57) ABSTRACT

Network chip utility is improved using multi-core architectures with auxiliary wiring between cores to permit cores to utilize components from otherwise inactive cores. The architectures permit, among other advantages, the re-purposing of functional components that reside in defective or otherwise non-functional cores. For instance, a four-core network chip with certain defects in three or even four cores could still, through operation of the techniques described herein, be utilized in a two or even three-core capacity. In an embodiment, the auxiliary wiring may be used to redirect data from a Serializer/Deserializer ("SerDes") block of a first core to packet-switching logic on a second core, and vice-versa. In an embodiment, the auxiliary wiring may be utilized to circumvent defective components in the packet-switching logic itself. In an embodiment, a core may utilize buffer memories, forwarding tables, or other resources from other cores instead of or in addition to its own.

19 Claims, 21 Drawing Sheets

NETWORK CHIP YIELD IMPROVEMENT ARCHITECTURES AND TECHNIQUES

TECHNICAL FIELD

Embodiments relate generally to computer networking, and, more specifically, to techniques for manufacturing network chips.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

A computer network is a set of computing components interconnected by communication links. Each computing component may be a separate computing device, such as, without limitation, a hub, switch, bridge, router, server, gateway, or personal computer, or a component thereof. Each computing component, or "network device," is considered to be a node within the network. A communication link is a mechanism of connecting at least two nodes such that each node may transmit data to and receive data from the other node. Such data may be transmitted in the form of signals over transmission media such as, without limitation, electrical cables, optical cables, or wireless media.

The structure and transmission of data between nodes is governed by a number of different protocols. There may be multiple layers of protocols, typically beginning with a lowest layer, such as a "physical" layer that governs the transmission and reception of raw bit streams as signals over a transmission medium. Each layer defines a data unit (the protocol data unit, or "PDU"), with multiple data units at one layer typically combining to form a single data unit in another. Additional examples of layers may include, for instance, a data link layer in which bits defined by a physical layer are combined to form a frame or cell, a network layer in which frames or cells defined by the data link layer are combined to form a packet, and a transport layer in which packets defined by the network layer are combined to form a TCP segment or UDP datagram. The Open Systems Interconnection model of communications describes these and other layers of communications. However, other models defining other ways of layering information may also be used. The Internet protocol suite, or "TCP/IP stack," is one example of a common group of protocols that may be used together over multiple layers to communicate information. However, techniques described herein may have application to other protocols outside of the TCP/IP stack.

A given node in a network may not necessarily have a link to each other node in the network, particularly in more complex networks. For example, in wired networks, each node may only have a limited number of physical ports into which cables may be plugged in to create links. Certain "terminal" nodes—often servers or end-user devices—may only have one or a handful of ports. Other nodes, such as switches, hubs, or routers, may have a great deal more ports, and typically are used to relay information between the terminal nodes. The arrangement of nodes and links in a network is said to be the topology of the network, and is typically visualized as a network graph or tree.

A given node in the network may communicate with another node in the network by sending data units along one or more different paths through the network that lead to the other node, each path including any number of intermediate nodes. The transmission of data across a computing network typically involves sending units of data, such as packets, cells, or frames, along paths through intermediary networking devices, such as switches or routers, that direct or redirect each data unit towards a corresponding destination.

While a data unit is passing through an intermediary networking device—a period of time that is conceptualized as a "visit" or "hop"—the device may perform any of a variety of actions, or processing steps, with the data unit. The exact set of actions taken will depend on a variety of characteristics of the data unit, such as metadata found in the header of the data unit, and in many cases the context or state of the network device. For example, address information specified by or otherwise associated with the data unit, such as a source address, a destination address, or path information, is typically used to determine how to handle a data unit (e.g. what actions to take with respect to the data unit). For instance, an Internet Protocol ("IP") data packet may include a destination IP address field within the header of the IP data packet, based upon which a network device may determine one or more other networking devices, among a number of possible other networking devices, to forward the IP data packet to. The logic within a network device that controls the specific set of actions performed with respect to a given data unit is often referred to as "packet-switching" logic.

A network device may include any number of internal hardware and/or software components configured to handle the movement of data units between processing components within the device and, eventually, out of the device. It is desirable for these components to quickly determine where to send and/or store data for processing, and to expediently send and/or store that data to the appropriate destination once determined. Moreover, it is desirable for these components to handle network traffic in a manner that will optimally utilize available network resources throughout the network in which the device is situated.

It is particularly desirable to implement packet-switching logic, to the extent possible, using hardware-based logic in integrated circuitry, referred to herein as chips, or network chips. However, due to the nature of the fabrication processes that produce these chips, and/or the semiconductor wafers on which they are fabricated, it is common to produce chips with one or more defects, whereby some or all of a chip is not useable. The die yield of a network chip design is a measure of the amount of useable chips that can be produced per a volume of wafers. For cost efficiency and other purposes, it is desirable to increase the die yield, or more generally increase the likelihood that a fabricated chip can be utilized.

BRIEF DESCRIPTION OF THE DRAWINGS

The present inventive subject matter is illustrated by way of example, and not by way of limitation, in the figures of the accompanying drawings and in which like reference numerals refer to similar elements and in which.

DETAILED DESCRIPTION

Figure 1:
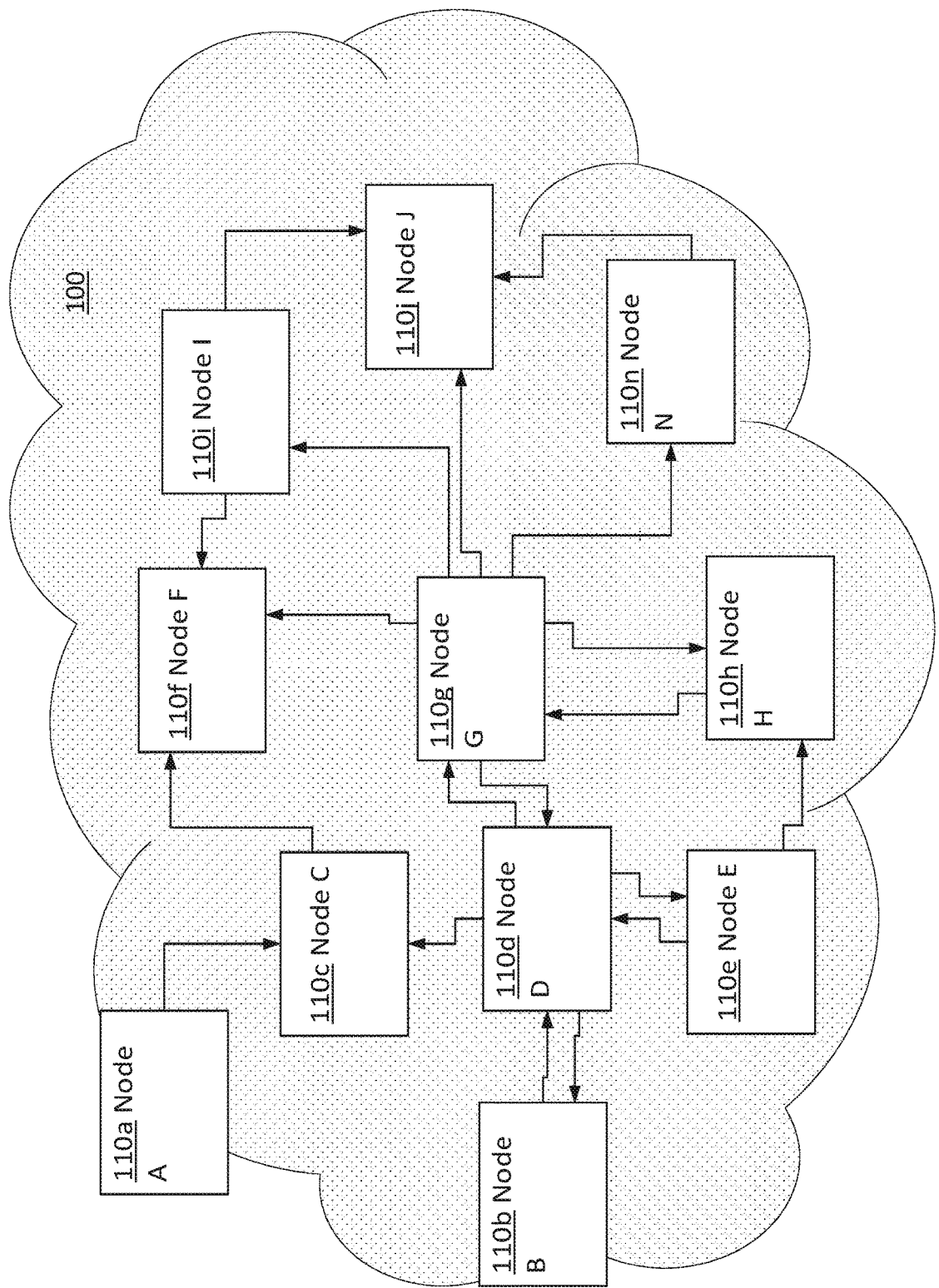
FIG. 1 is an illustrative view of various aspects of an example networking system in which the techniques described herein may be practiced.

In the following description, for the purposes of explanation, numerous specific details are set forth in order to provide a thorough understanding of the present inventive subject matter. It will be apparent, however, that the present inventive subject matter may be practiced without these specific details. In other instances, well-known structures and devices are shown in block diagram form in order to avoid unnecessarily obscuring the present inventive subject matter.

Embodiments are described herein according to the following outline:

1.0. General Overview
2.0. System Overview
2.1. Networks
2.2. Multi-Core Network Chip
2.3. Example Core
2.4. Chip Defects
2.5. Auxiliary Wiring
2.6. Auxiliary Wiring to Multiple Cores
2.7. Repurposing Buffer and Other Resources from inactive Cores
2.8. Logical Cores
2.9. Example Auxiliary Wiring Scheme
2.10. Example Ingress and Egress Blocks
3.0. Functional Overview
3.1. Data Unit Handling Flow
3.2. Programming a Device Profile
3.3. Configuring a Chip with a Device Profile
4.0. Example Embodiments
5.0. Implementation Mechanism—Hardware Overview
6.0. Extensions and Alternatives 1.0. General Overview Approaches, techniques, and mechanisms are disclosed for improving die yield and utility of network chips using multi-core architectures with auxiliary wiring between cores to permit the cores to utilize components from otherwise inactive cores when needed to compensate for defects or other issues. The architectures permit, among other advantages, the re-purposing of functional components that reside in defective or otherwise non-functional cores. Without the auxiliary wiring and associated configuration logic described herein, certain combinations of defects would severely limit the performance of these multi-core network chips, or even render them unusable. However, the architectures disclosed herein permit the chips to operate with a higher number of cores and/or at higher capacity than they would otherwise have. For instance, a four-core network chip with certain defects in three or even four cores could still, through operation of the techniques described herein, be utilized in a two or even three-core capacity.

Moreover, in an embodiment, the techniques described herein may allow for greater flexibility in integrating the network chips into systems. For instance, the techniques may be utilized to allow for consistency in the selection of which input/output ("I/O") blocks, such as Serializer/Deserializer ("SerDes") blocks, of a lower-specification chip are "bumped out," in that communications from the I/O blocks may be re-routed to a functional core if the core to which they are directly attached has a defect.

In an embodiment, the auxiliary wiring may be used to redirect data from an I/O block of a first core to packet-switching logic on a second core, and vice-versa. For instance, the packet-switching logic of the first core may be defective, while the I/O block of the second core may be defective or unused for other reasons. The auxiliary wiring may be deployed at any point between the I/O block of the first core and the packet-switching logic of the second core, such as before or at an interface controller block.

In an embodiment, the auxiliary wiring may be utilized to circumvent defective components in the packet-switching logic itself. The packet-switching logic may include, for instance, an ingress block for performing ingress processing on data units arriving at the core via a corresponding I/O block, and an egress block for performing egress processing on data units received from the ingress block and/or from other cores (e.g. via an interconnect) prior to sending those data units back out the I/O block. If the ingress block of a first core is defective, but not the egress block, data units received by the first core may be re-routed via the auxiliary wiring to the ingress block of a second core that is otherwise inactive (e.g. on account of other defects or configuration issues). Data units would still be processed by the egress block of the first core on their way out of the first core. On the other hand, if the egress block of the first core were defective, but not the ingress block, data intended for the egress block of the first core may be redirected to the egress block of an otherwise inactive second core. The auxiliary wiring may then be used to return those data units back to the first core to be sent to their final destinations.

In an embodiment, the direction of the auxiliary wiring is interchangeable. Hence, the same auxiliary wiring could be used to exchange data between any of a variety of components of two cores, with the exact use (if any) being programmed based on which components (if any) of the cores were actually defective. In an embodiment, depending on the configuration, the same auxiliary wiring used to redirect data between I/O blocks and packet-switching logic on different cores may also be utilized to circumvent defective ingress blocks or egress blocks, though in other embodiments there may be separate wiring for these purposes.

In an embodiment, since it is not typically known which components of which cores will actually be defective until after the chip has been fabricated and tested, the chip includes device configuration logic that controls if and how the auxiliary wiring is utilized. The testing process may reveal that the chip has certain defects. A particular device configuration may be selected for the chip in view of these defects, so as to optimize performance and/or utility of the chip. A chip may be programmed with a particular profile that reflects the selected configuration. Based on the profile, when the device is powered, the device configuration logic dynamically configures the device to enable the particular configuration, by activating or deactivating various components, providing appropriate signals to muxes and/or other components responsible for directing data over the auxiliary wiring, and so forth.

Each core on the chip may have a fixed physical identifier, by which the core may be addressed by other cores, management logic, and/or other components of the chip when generating and sending messages, instructions, and so forth. However, from a logical perspective, the functions of a single core may actually be spread across multiple physical cores. That is, an arrangement of core components from potentially different physical cores may be configured to function as a single "logical core." To reduce the complexity of higher-level logic on the chip, such as forwarding tables, packet-switching logic, packet processors, core management logic, etc., rather than trying to compensate for all possible configurations of the physical core components, the higher-level logic may internally refer to logical cores instead of physical cores. The chip may then include mapping logics that convert between logical core identifiers and physical core identifiers when it comes time to actually physically communicate data to a component of one of these logical cores.

For instance, an ingress block may be configured to insert the identifier of a logical core to which a data unit should be sent in the control information of the data unit. The mapping logic may translate this logical core identifier to a physical core identifier when sending the data unit to an interconnect, referred to herein as a crossbar, that is responsible for relaying the data unit to the egress block of the destination logical core. The crossbar, which may be unaware of the logical mapping scheme, may thus use the physical core identifier to determine where to send the data unit.

In an embodiment, the auxiliary wiring may be utilized to redirect data from I/O blocks at one core to the packet-switching logic of another core even when the I/O blocks of the other core are also active. In this manner, the device may continue to support the I/O blocks of both cores, even though its overall bandwidth for processing those I/O blocks would be half that of a fully-functional chip. For instance, in a four-core network chip with 256 SerDes lanes, there may be 64 SerDes lanes in each core. If only two of the cores are active, there would normally be only 128 useable SerDes lanes. However, the auxiliary wiring disclosed herein would allow all 256 SerDes lanes to be used. If the device bandwidth when all four cores were active were 100 Gbps, the device bandwidth under this configuration would be only 50 Gbps on account of the reduction to two active cores.

In an embodiment, a core may utilize resources from other cores instead of or in addition to its own. For instance, packet-switching logic from an active core may utilize a buffer memory from an inactive core to replace or double its buffering capacity. Similarly, forwarding logic may utilize a forwarding table from an inactive core to replace its forwarding table or double its forwarding table size. There may be separate auxiliary wiring to facilitate this repurposing of resources, or the same auxiliary wiring may be used as with the I/O blocks.

In an embodiment, the techniques and architectures described herein may be utilized for multi-core network chips with any number of cores. For instance, auxiliary wiring between cores in an eight-core chip may permit the use of four or six core configurations even when more than four cores are defective.

In an embodiment, the auxiliary wiring need not connect all cores on the chip, but rather the auxiliary wiring may only exist between adjacent pairs of cores. Or, a core may be connected only to two or three adjacent cores via auxiliary wiring. Moreover, not all cores need to have auxiliary wiring in all embodiments. For instance, in a six-core chip, there might only be auxiliary wiring between two pairs of the cores, with the last two cores having no such wiring at all.

In an embodiment, the auxiliary wiring may be used to route data through other components of other cores beyond the example components described herein, and/or to re-purpose other resources from other cores than the example resources given herein.

2.0. System Overview

2.1. Networks

FIG. 1 is an illustrative view of various aspects of an example networking system 100, also referred to as a network, in which the devices described herein may be utilized, according to an embodiment. Networking system 100 comprises a plurality of interconnected nodes 110a-110n (collectively nodes 110), each implemented by a different computing device. For example, a node 110 may be a single networking computing device, such as a router or switch, in which some or all of the processing components described herein are implemented in application-specific integrated circuits (ASICs), field programmable gate arrays (FPGAs), or other integrated circuit(s). As another example, a node 110 may include one or more memories storing instructions for implementing various components described herein, one or more hardware processors configured to execute the instructions stored in the one or more memories, and various data repositories in the one or more memories for storing data structures utilized and manipulated by the various components.

Each node 110 is connected to one or more other nodes 110 in network 100 by one or more communication links, depicted as lines between nodes 110. The communication links may be any suitable wired cabling or wireless links connected to I/O blocks in the nodes 110 on both ends. Note that system 100 illustrates only one of many possible arrangements of nodes within a network. Other networks may include fewer or additional nodes 110 having any number of links between them.

While each node 110 may or may not have a variety of other functions, in an embodiment, each node 110 is configured to send, receive, and/or relay data to one or more other nodes 110 via these links. In general, data is communicated as series of discrete units or structures of data represented by signals transmitted over the communication links.

Different nodes 110 within a network 100 may send, receive, and/or relay data units at different communication levels, or layers. For instance, a first node 110 may send a unit of data at the network layer (e.g. a TCP segment) to a second node 110 over a path that includes an intermediate node 110. This unit of data will be broken into smaller units of data at various sublevels before it is transmitted from the first node 110. These smaller data units may be referred to as "subunits" or "portions" of the larger data unit.

For example, a TCP segment may be broken into packets, then cells, and eventually sent out as a collection of signal-encoded bits to the intermediate device. Depending on the network type and/or the device type of the intermediate node 110, the intermediate node 110 may rebuild the entire original data unit before routing the information to the second node 110, or the intermediate node 110 may simply rebuild certain subunits of data (e.g. frames and/or cells) and route those subunits to the second node 110 without ever composing the entire original data unit.

When a node 110 receives a unit of data, it typically examines addressing information within the unit of data (and/or other information within the unit of data) to determine how to process the unit. The addressing information may be, for instance, an Internet Protocol (IP) address, MPLS label, or any other suitable information. If the addressing information indicates that the receiving node 110 is not the destination for the data unit, the receiving node 110 may look up the destination node 110 within the receiving node's routing information and route the data unit to another node 110 connected to the receiving node 110 based on forwarding instructions associated with the destination node 110 (or an address group to which the destination node belongs). The forwarding instructions may indicate, for instance, an outgoing port over which to send the unit of data, a label to attach the unit of data, etc. In cases where multiple paths to the destination node 110 are possible, the forwarding instructions may include information indicating a suitable approach for selecting one of those paths, or a path deemed to be the best path may already be defined.

Addressing information, flags, labels, and other metadata used for determining how to handle a data unit are typically embedded within a portion of the data unit known as the header. The header is typically at the beginning of the data unit, and is followed by the payload of the data unit, which is the information actually being sent in the data unit. A header is typically comprised of fields of different types, such as a destination address field, source address field, destination port field, source port field, and so forth. In some protocols, the number and the arrangement of fields may be fixed. Other protocols allow for arbitrary numbers of fields, with some or all of the fields being preceded by type information that explains to a node the meaning of the field.

For convenience, this disclosure may at times refer to embodiments where the data units are IP packets in a L3 (level 3) network, and the subunits are the constituent cells and frames thereof in an L2 (level 2) network, in which contexts the described techniques have particular advantages. It will be recognized, however, that these techniques may also be applied to realize advantages in routing other types of data units conforming to other protocols and/or at other communication layers within a network. Thus, unless otherwise stated or apparent, the techniques described herein should also be understood to apply to contexts in which the data units and subunits are of any other types of data structures communicated across a network, such as segments, InfiniBand Messages, or datagrams. That is, in these contexts, other types of data structures may be used in place of packets, cells, frames, and so forth.

Any node in the depicted network 100 may communicate with any other node in the network 100 by sending data units through a series of nodes 110 and links, referred to as a path. For example, Node B (110*b*) may send data units to Node H (110*h*) via a path from Node B to Node D to Node E to Node H. There may be a large number of valid paths between two nodes. For example, another path from Node B to Node H is from Node B to Node D to Node G to Node H.

In an embodiment, a node 110 does not actually need to specify a full path for a data unit that it sends. Rather, the node 110 may simply be configured to calculate the best path for the data unit out of the device (e.g. which egress port it should send the data unit out on). When a node 110 receives a data unit that is not addressed directly to the node 110, based on header information associated with a data unit, such as path and/or destination information, packet-switching logic within the node 110 relays the data unit along to either the destination node 110, or a "next hop" node 110 that the node 110 calculates is in a better position to relay the data unit to the destination node 110. In this manner, the actual path of a data unit is product of each node 110 along the path making forwarding decisions about how best to move the data unit along to the destination node 110 identified by the data unit.

2.2. Multi-Core Network Chip

Figure 2:
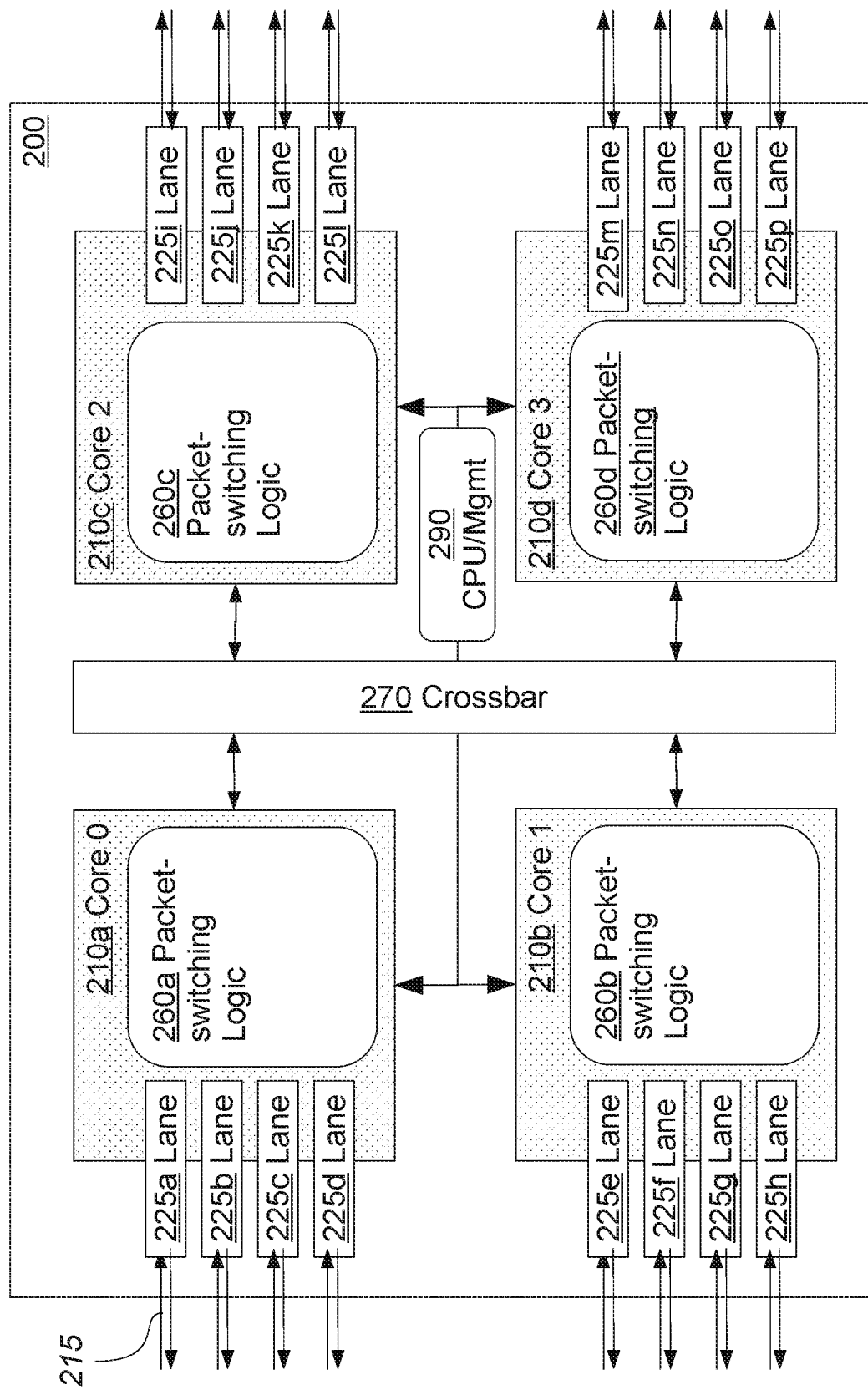
FIG. 2 illustrates an example multi-core network chip.

FIG. 2 illustrates an example multi-core network chip 200, according to an embodiment. Chip 200 comprises one or more one or more application-specific integrated circuits (ASICs), field programmable gate arrays (FPGAs), or other integrated circuit(s) on a silicon or other semiconductor die, along with, in some embodiments, suitable packaging (not depicted). Certain devices in a network, such as switches or routers, may include one or more of such chips 200 to implement packet-switching logic for interconnecting other devices in the network. For instance, some or all of the non-terminal nodes 110 in network 100 may include at least one network chip 200. Among other deployment options, network chip 200 may be part of a standalone network switch (e.g. in simpler networks), or physically interconnected with a number of other chips 200 (e.g. via a printed circuit board ("PCB"), backplane, or other external circuitry) in a suitable chassis (e.g. for use in a large data center).

Chip 200 includes four cores 210, labeled cores 210*a-d*. The number of cores 210 is illustrative, as different chip designs may have different numbers of cores 210, such as two, six, eight, or even more. The components of a core 210 may, in some embodiments, be congregated into a same physical area on the chip 200 that is distinct from the areas at which the other cores 210 resides. However, in other embodiments, physical separation between each of the cores 210 is not strictly necessary. In an embodiment, each core 210 is, substantially, a copy of the same set of components. Each core 210 may or may not be a separate integrated circuit, depending on the embodiment.

I/O Lanes

Each core includes a plurality of I/O lanes 225, labeled lanes 225*a-p*. The I/O lanes 225 generally comprise receivers and transmitters configured, respectively, to receive and send electric signals representative of data units. Each I/O lane 225 is physical connected to a channel 215. This physical connection serves as an external or "southbound" interface for the lane 225. The interface will generally include a receive terminal for receiving signals over the channel 215 and a transmit terminal for sending signals over the channel 215. A channel 215, in turn, will generally include separate lines for receiving and sending signals. The I/O lanes 225 of a core collectively form an I/O block. Although four lanes 225 are depicted per core 210, a core may have any number of lanes.

Channels 215 may link the chip 200 to other chips 200 and/or other network devices. Channels 215 may include a variety of components, depending on the embodiment and systems in which the chip 200 are integrated. For instance, the channels 215 may include on-chip leads or other connectors in the packaging that lead from terminals on the die to pads and bumps or other interconnects, which in turn are connected to traces or other wires off-chip. The channels 215 may also include physical connectors such as Ethernet jacks or Small Form-factor Pluggable ("SFP") connectors, optical or electrical wiring, and so forth. Channels 215 are an example of the links between nodes 110 in FIG. 1.

An I/O lane 225 is said to be "bumped out" if it is connected in some manner to components of a channel 215 off-chip. Depending on the context, bumping out may involve connecting terminals on the die itself to leads or other wiring in the packaging, connecting pads from the die to external circuitry (e.g. via solder bumps or other interconnects), or otherwise coupling the I/O lane to an off-chip component. Not all I/O lanes 225 will necessarily be bumped out, on account of the configuration of the system into which the chip 200 is integrated. For instance, a chip 200 might be integrated into a system that does not have enough Ethernet jacks to fully utilize every I/O lane 225, in which case there may not be enough off-chip traces to connect each I/O lane 225. Or, certain chips 200 may be configured in a lower-capacity mode in which not all lanes 225 are active. Chip packaging for such lower-capacity chips 200—and consequently the boards into which the chips 200 are integrated—may be designed around the assumption that certain lanes 225 are bumped out, while the other lanes 225 are not. Consistency in which lanes 225 are bumped out—which is more readily achievable using the techniques described herein—is thus desirable to avoid or reduce the need for different packaging and external circuitry designs.

Each I/O lane 225 further includes an internal or "northbound" interface via which its sends the data it receives from its channel 215 to packet-switching logic 260 in the core. Further, via this interface, the I/O lane 225 receives, in return, data from the packet-switching logic 260 to send back out the channel 215. Note that the internal interface of the I/O lane may not necessarily connect directly to the packet-switching logic 260 (e.g. via direct wires), but may rather be coupled to it indirectly via one or more intermediary components such, such as interface controllers, ports, and so forth.

Typically, the I/O lane 225 will perform some modification to the signals and data it receives. For example, in an embodiment, each I/O block implements aspects of a physical layer of a network protocol stack, and may optionally implement aspects of a data link layer as well. The exact manner by which the I/O lane 225 prepares data for use by the packet-switching logic 260, and prepares data for sending back out over the network, will vary from embodiment to embodiment, depending on the standards, protocols, and hardware utilized. For instance, the I/O lane 225 may decode one or more line codes in an incoming signal, including without limitation, non-return-to-zero ("NRZ"), pulse-amplitude modulation ("PAM"), 64b/66b encoding, and/or other similar encodings. As another example, the I/O lane 225 may descramble, align, synchronize, deskew, and/or perform block and symbol redistribution. As yet another example, the I/O lane 225 may deserialize the data, thereby forming a plurality of parallel data streams. Of course, other processing may be performed in addition to or instead of the foregoing, and the processing may be reversed by the I/O lane 225 before sending data back out as signals over the network. Unless otherwise apparent from the context, the inventive architectures described herein are not specific to any particular arrangement of components in the I/O lanes 225.

Packet-Switching Logic

The packet-switching logic 260, in general, identifies specific data units within the data, determines one or more destinations for these data units, and then sends these data units to the determined destinations, as system resources may permit. The destinations correspond to I/O lanes 225, typically other than the I/O lane on which a particular data unit was received. For instance, the packet-switching logic 260 may receive data belonging to a first data unit via I/O lane 225a, determine that the data should be sent to a destination that corresponds to I/O lane 225d, and forward the data towards I/O lane 225d for sending back out over the network.

In most embodiments, the data units will not themselves specify the I/O lanes 225 to which they should be sent. Rather, the packet-switching logic 260 includes forwarding logic that resolves a destination for the data unit based on addressing information in the header of the data unit. For instance, a data unit may include a destination address field in its header that specifies an Internet Protocol ("IP") address to which the data unit should be sent. The packet-switching logic 260 may look-up this IP address in a forwarding table or other mapping data, identify one or more destinations mapped to the IP address, and forward the data unit towards those destinations.

Moreover, in some embodiments, the packet-switching logic 260 may not necessarily recognize specific I/O lanes 225 as destinations. For example, I/O lanes 225 may be mapped to ports or other constructs at a controller level. The mapping may be a one-to-one mapping, or I/O lanes 225 may be aggregated together, such that a data unit intended for a given destination might be sent out any one of several I/O lanes 225 mapped to that destination. The packet-switching logic 260 may be configured to send the data units to a controller with a specification of the port or other destination to which the data unit should be sent, and the controller may select the specific I/O lane 225 out which the data unit should be sent.

Data units may be sent out I/O lanes 225 that are not necessarily in the same core 210 as the I/O lanes 225 on which they were received. To account for such cases, chip 200 includes a crossbar 270 that is coupled directly or indirectly to the packet-switching logic 260 of each core. A core's packet-switching logic 260 may be configured to send such data units to a crossbar 270. Crossbar 270 then determines, based on instruction(s) that the packet-switching logic 260 generated when initially processing the data unit, which cores 210 to send the data units to. The packet-switching logics 260 at those cores then process the data units and forward the data units to their corresponding destination I/O lanes 225.

For example, a data unit may be received at packet-switching logic 260a of core 210a via I/O lane 225c. Depending on the embodiment, the packet-switching logic 260a may or may not know a specific port to which the data unit should be forwarded, but will nonetheless at least be able to recognize that the data unit should be forwarded to a destination on core 210b. The packet-switching logic 260a generates an instruction to crossbar 270 to send the data unit to core 210b, and sends the instruction with the data unit (either inserted into its header, or as sideband data associated with the data unit) to the crossbar 270. Based on the instruction, the crossbar 270 sends the data unit to the packet-switching logic 260b at core 210b. The packet-switching logic 260b may then resolve the actual destination for the data unit (e.g. I/O lane 225h) and forward the data unit to that lane 225.

The ordered list of components through which a data unit passes in a chip 200 is referred to herein as the path of the data unit through the chip 200. For instance, the path of the data unit mentioned above would be lane 225c to packet-switching logic 260a to crossbar 270 to packet-switching logic 260b to lane 225h. Note that data units that will go out an I/O lane 225 on the same core 210 as the I/O lane 225 on which it was received need not necessarily be sent to the crossbar 270, but could be, depending on the embodiment. For instance, the path of a data unit might be lane 225a to packet-switching logic 260a to crossbar 270 to packet-switching logic 260a to lane 225d.

A data unit may be sent to multiple destinations. For instance, a data unit may be sent to a multicast address, or a unicast address that resolves to multiple destinations. In such cases, the packet-switching logic 260 may be configured to make copies of the data unit as necessary, and forward the copies to different destinations.

Depending on the embodiment, the packet-switching logic 260 may comprise a variety of components for performing the above functions in an optimal manner, including buffer memories, tables, packet processors, and so forth. Examples of such components are described, without limitation, in subsequent sections. However, unless otherwise apparent from the context, the inventive architectures described herein are not specific to any particular arrangement of components in the packet-switching logic.

It will be appreciated that the actual physical representation of a data unit in chip 200 may change at various stages and in various components as a result of the processes described herein. For instance, a data unit may be converted from a physical representation at a particular location in one memory to a signal-based representation, and back to a physical representation at a different location in a potentially different memory, as it is moved from one component to another within a chip or even between network devices. Such movement may technically involve deleting, converting, and/or copying some or all of the data unit any number of times. Moreover, data from the data unit may be interleaved or encoded with data from other data units at times, both in physical and in signal form. For simplification, however, the data unit is logically said to remain the same data unit as it moves through the device, even if the physical and/or signal representation of the data unit changes. Similarly, the contents and/or structure of a data unit may change as it is processed, such as by adding or deleting header information, adjusting cell boundaries, or even modifying payload data. A modified data unit is nonetheless still said to be the same data unit, even after altering its contents and/or structure.

Cpu/Management Block

Chip 200 further includes a management block 290. Management block 290 is generally configured to manage operations of the cores 210, and may include logics such as device configuration logic, forwarding table management logic, error logging logic, debugging logic, user interface logic, and so forth. In an embodiment, a central processor unit implements some or all of this logic, though in other embodiments there may be dedicated hardware on which some or all of the management logic is off-loaded.

In an embodiment, to configure the cores 210, the management block 290 may be configured to send various signals or other instructions to various components of the cores 210, and comprise suitable wiring for doing so. In an embodiment, the management block 290 may itself need to communicate over the network for interfacing, logging, or other purposes. Management block 290 may thus include logic, interfaces, and wiring for injecting data units directly into the packet-switching logic 260 of the appropriate core(s) to which the data units need to be sent.

2.3. Example Core

Figure 3:
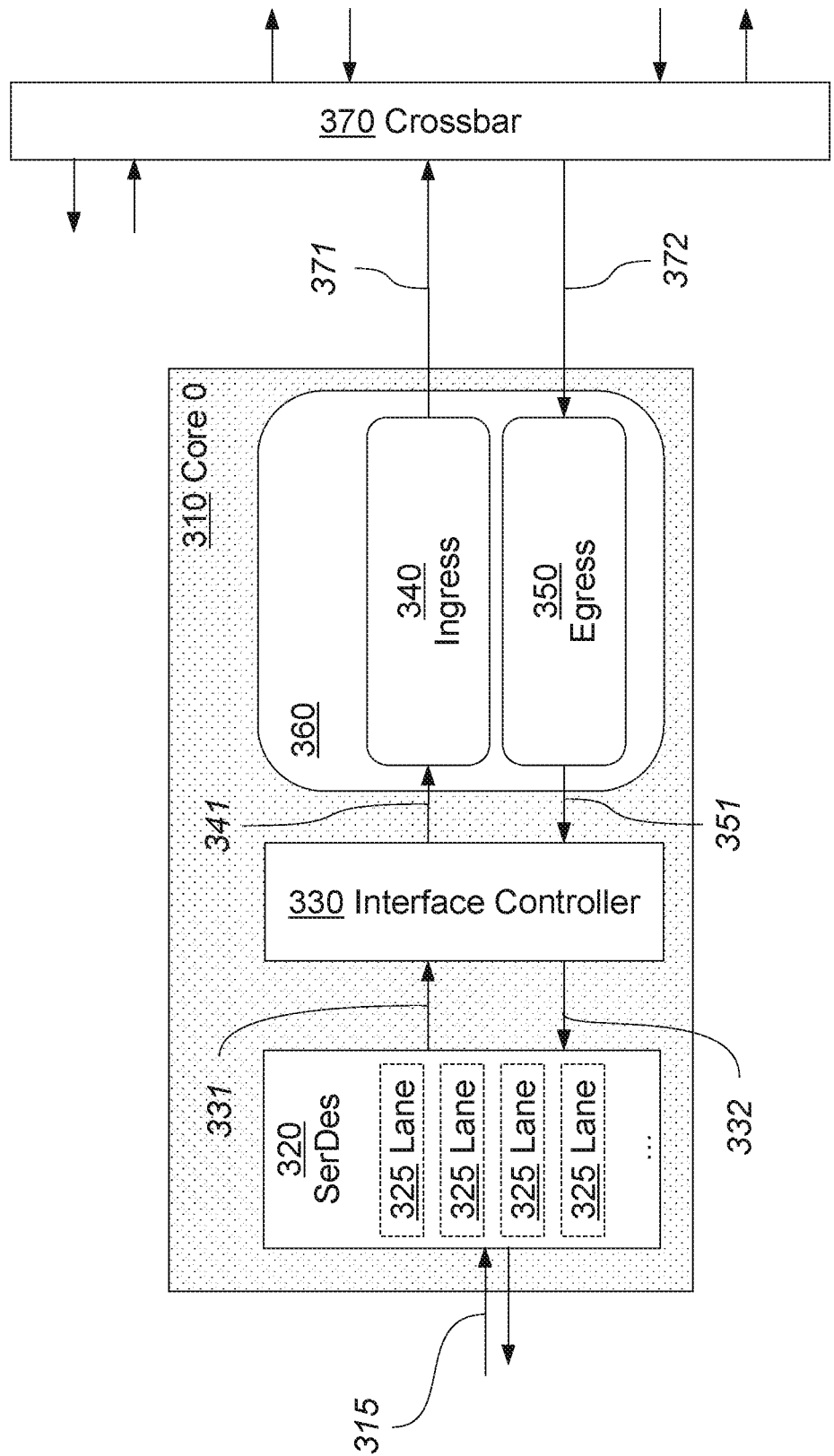
FIG. 3 illustrates an example core for a network chip.

FIG. 3 illustrates an example core 310 for a network chip, according to an embodiment. Core 310 is an example of a core 210, though it will be recognized that core 210 may be implemented without some or all of the specific details of core 310.

Serdes Block

Core 310 includes a SerDes block 320, comprising SerDes lanes 325. SerDes lanes 325 are example I/O lanes 225, and SerDes block 320 is thus an example I/O block. For convenience, the embodiments given throughout the remainder of the disclosure will typically refer to embodiments in which the I/O block is a SerDes block and the I/O lanes are SerDes lanes. However, it will be understood that the SerDes block and SerDes lane may be replaced by any other suitable I/O block and I/O lane, in other embodiments.

SerDes lanes 325 interface externally with channels 315, which are similar to channels 215, via serial interfaces. A SerDes lane 325 comprises, among other elements, a deserializer for deserializing serialized data received over its corresponding channel 315, and a serializer for serializing data before transmitting back out the channel 315. The number and type of SerDes may vary from embodiment to embodiment. For instance, the SerDes lanes may implement 112G PAM4, 56G PAM4, 56G NRZ, or any other suitable standards. Each core 310 might comprise four, eight, sixteen, thirty-two, or any other number of SerDes lanes.

Each SerDes lane 325 is coupled to an interface controller block 330 via an outbound internal (e.g. northbound) interface 331, as a well as a corresponding inbound internal (e.g. southbound) 332 from the controller block 330. The interfaces 331/332 may be parallel rather than serial, and may comprise any suitable wiring. In an embodiment, the interfaces are media-independent interfaces and connect to the SerDes lanes 325 via Physical Coding Sublayers ("PCS"), though in other embodiments, the interfaces may take other forms, and the SerDes lanes 325 need not comprise the PCS.

Interface Controller Block

The interface controller block 330 is responsible for preparing the data sent by the SerDes block 320 for consumption by the packet-switching logic 360, and vice-versa. For instance, the interface controller block 330 may be configured to form data units, or at least their constituent subunits, from the data processed by the SerDes lane 320, and to multiplex data units for transmission on return from the packet-switching logic 360. In an embodiment, the interface controller block 330 may implement a data link layer of a network protocol stack. For instance, the interface controller block 330 may include logic for functions such as frame/cell recognition and delimiting, error checking, flow control, and so forth. In an embodiment, the interface controller block 325 may include media access control ("MAC") blocks for each of the SerDes lanes 325, as well as a logical link control block in certain implementations.

In some embodiments, SerDes block 320 and interface controller block 330 need not be strictly separate, and their combined functionality may be achieved in a single block.

Ingress Block

The packet-switching logic 360 of core 310 is divided into two distinct subblocks—ingress block 340 and egress block 350. Ingress block 340 comprises an inbound ingress interface 341 by which it receives data from interface controller block 330. Inbound ingress interface 341 may be any suitable wiring and comprise any number of lines, depending on the embodiment. In an embodiment, the inbound ingress interface 341 may be coupled to a plurality of ports, also referred to as ingress ports, in the interface controller block 330. Each port may correspond to different sets of one or more SerDes lanes 325. For instance, each ingress port may be an interface of a media access control ("MAC") block or logical link layer in the interface controller block 330.

Ingress block 340 is generally configured to perform ingress processing on data units, including recognizing data units, determining destinations for those data units, and forwarding the data units towards those destinations. Ingress block 340 may send those data units, either in complete form, or at a subunit granularity (e.g. cell or frame), to a crossbar 370 (which may be similar to crossbar 270). Ingress block 340 is coupled to the crossbar 370 by an outbound ingress interface 371, which may comprise any suitable wiring. Ingress block 340 further sends an instruction (e.g. control information) in association with the data unit that indicates the destination for the data unit. The destination may simply be an identifier for another core 310, or may refer to a specific port, queue, or other construct, depending on the embodiment.

In some embodiments, ingress block 340 may comprise logic for implementing a variety of other features related to the forwarding of the data units it receives. Example components of an ingress block 340 are described, without limitation, in other sections.

Egress Block

Egress block 350 comprises an inbound egress interface 372 by which it is coupled to and receives data from the crossbar 370. Egress block 350 is generally configured to perform egress processing on the data units it receives, such as determining destination ports for the data units based on the data units themselves or instructions generated by the ingress block 340, manipulating the data units if necessary, and forwarding the data units to the identified destinations.

Egress block 350 further comprises an outbound egress interface 351 by which it is coupled to the interface controller block 330 and sends data units to destinations. The outbound egress interface 351 may comprise any number of lines, each corresponding to a different port ("egress ports"), MAC block, and/or set of SerDes lanes 325.

In an embodiment, egress block 350 may each comprise an internal interface by which ingress block 340 may send data units and instructions to it directly, without going through the crossbar 370. Hence, if a data unit is destined for a SerDes lane 325 from the same SerDes block 320 as that which it arrived on, the data unit may be sent directly to the egress block 350 instead of being routed through the crossbar 370. In other embodiments, such an interface may be omitted.

In some embodiments, egress block 350 may comprise logic for implementing a variety of other features related to the forwarding of the data units it receives. Example components of an egress block 350 are described, without limitation, in other sections.

2.4. Chip Defects

As mentioned above, it is possible that, on account of imperfections in wafers, fabrication errors, and other issues, certain components on a fabricated die will be defective and unusable. For instance, there may be defects in one or more of SerDes block 320, interface controller block 330, ingress block 340, or egress block 350. In most architectures a defect to any of these components would render the entire core unusable.

Figure 4:
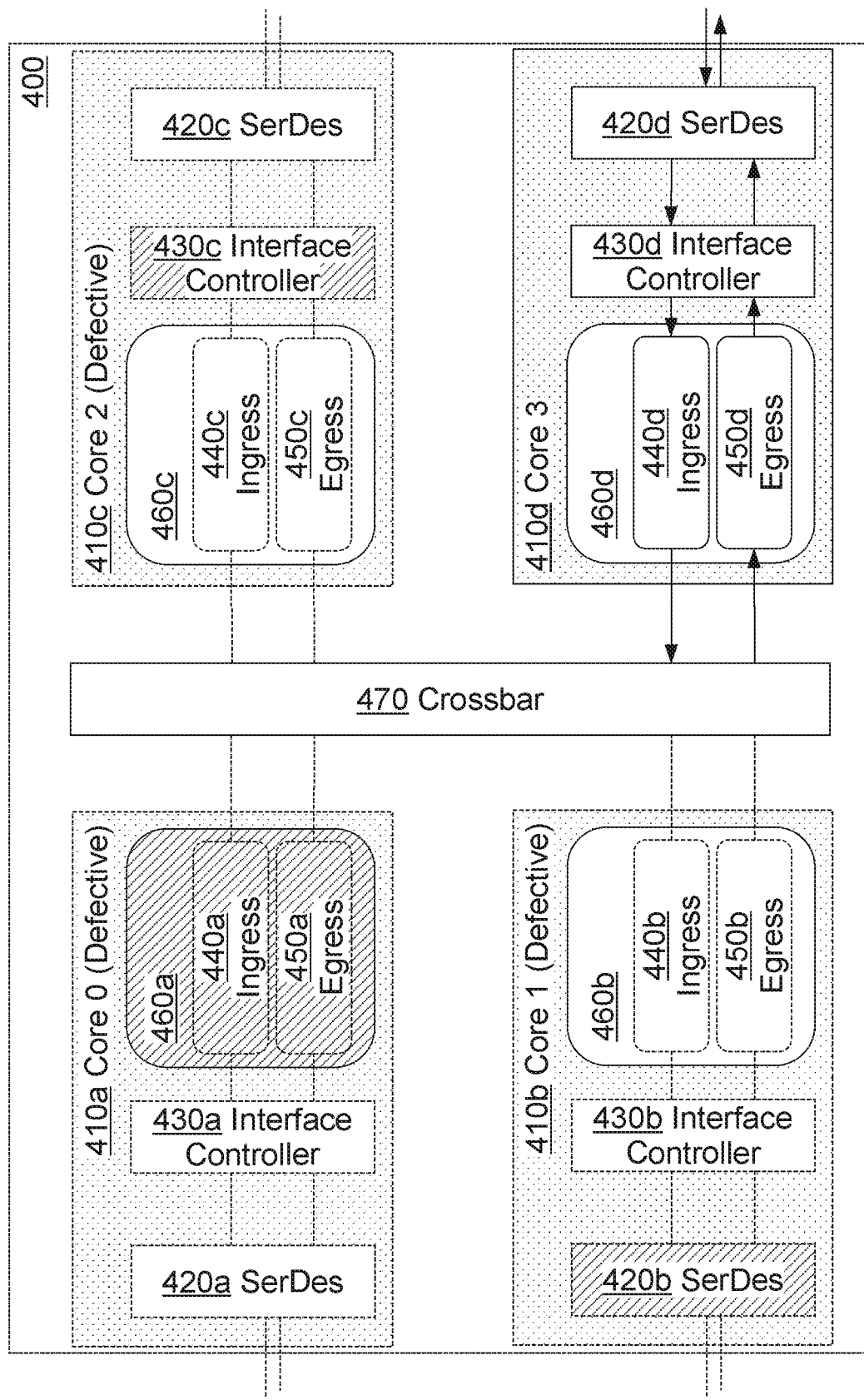
FIG. 4 illustrates an example multi-core chip with defects in three out of its four cores.

For example, FIG. 4 illustrates an example multi-core chip 400 with defects in three of its four cores 410. Chip 400 comprises an arrangement of cores 410 and underlying components 420-470 that are each similar to core 310 and its constituent components 320-370, respectively. However, as indicated using the diagonal fill pattern, core 410a has a defect in one or both of its ingress block 440a or egress block 450. Meanwhile, core 410b has a defect in its SerDes block 420b. Furthermore, core 410c has a defect in its interface controller block 430c. Only core 410d is non-defective.

In some embodiments, a defective multi-core chip can still be utilized as a lower-specification chip. For instance, chip 400 could still be utilized as a single-core network chip that provides switching for just the set of channels coupled to SerDes block 420d. Or, if one of cores 410a-410c were also non-defective, chip 400 could still be utilized as a dual-core network chip, assuming the crossbar 470 were still functional.

A manufacturer of such chips may submit the chips to a series of tests designed to detect defective components. A component may be defective because it outright fails to perform its intended function under all or certain conditions, or because it fails to meet some desired performance threshold. The manufacturer may sell non-defective chips as full capacity chips. Other chips may be sold as lower capacity chips, based on the number of cores that that tests reveal to be functional. Of course, some chips may be entirely inoperable due to defects in all cores, or the number of non-defective cores in a chip may be so low that the chip is simply not marketable.

2.5. Auxiliary Wiring

As further explained above, according to embodiments, die yield for multi-core network chips may be increased, and chips with defects may function at higher capacities, when using multi-core architectures with inter-core auxiliary wiring between at least some of the cores. The inter-core auxiliary wiring permits cores to route around defective components, through non-defective counterparts to those components on other cores that are not being used. In general, this may comprise routing certain communications that are typically intra-core data communications between components in the same physical core to working counterpart components in another core.

Figure 5:
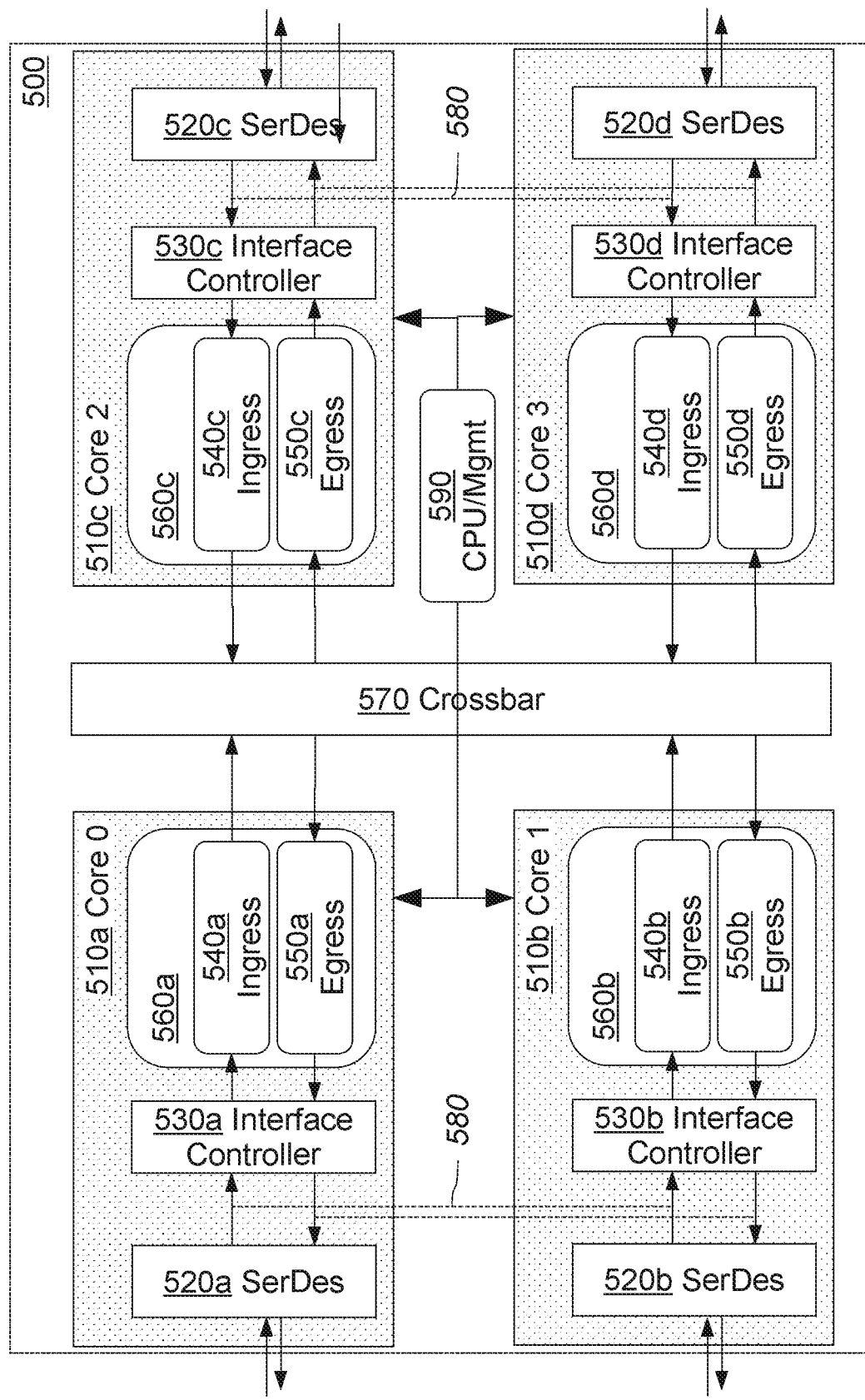
FIG. 5 illustrates an example multi-core chip with auxiliary wiring by which data may be routed around defective components to serviceable components in other cores.

For example, FIG. 5 illustrates an example multi-core chip 500 with auxiliary wiring 580 by which data may be routed around defective components to serviceable components in other cores, according to an embodiment. Chip 500 includes multiple cores 510a-510d connected by a crossbar 570. Each core 510 is similar to core 310, in that each core 510 comprises a SerDes block 520, interface controller block 530, packet-switching logic 560, ingress block 540, and egress block 550. Chip 500 further includes a management block 590, similar to management block 290.

Chip 500 further includes auxiliary wiring 580 that interconnects pairs of cores, including the wiring 580 between core 510a and 510b, as well as the wiring between core 510c and 510d. The auxiliary wiring 580 may be any sort of wiring or interconnect. In an embodiment, the wiring 580 is deployed in or near the interface controller blocks 530, such that data may be diverted on its way to or from an interface controller block 530. In an embodiment, the auxiliary wiring 580 includes sufficient wiring for both cores 510 it connects to transmit and receive. However, the number of wires may be a function of a variety of factors, depending on the implementation, such as the number of SerDes lanes 520 in the SerDes blocks 520, the number of parallel outputs of those lanes 520, the number of MAC blocks in the interface controller block 530, etc.

Under normal operating conditions, such as when all cores 510 are functional and active, the auxiliary wiring 580 is not used, as indicated in FIG. 5 by their depiction using dashed lines. However, under certain operating conditions, such as when there are defects in certain cores 510, the auxiliary wiring 580 may be utilized to ship data between cores so as to work around defective components and/or re-purpose non-defective components in otherwise inactive cores.

For instance, the management block 590 may include device configuration logic that loads a device profile (e.g. during a boot operation when the chip 500 is first powered). The device profile may indicate that certain components in certain cores have been disabled for defects or other reasons, and that the auxiliary wiring 580 should be used in a specific manner to route around those components. Accordingly, the device configuration logic may send signals or instructions to various components within the cores 510 involved in the rerouting, so as to cause the components of those chips 510 to divert data through the auxiliary wiring 580 as needed.

In some embodiments, the device profile is relatively fixed—that is, beyond initial programming when the die is first tested after fabrication, the profile might not ever change. Or, the profile might be reprogrammable by a systems administrator later on (e.g., if new defects or performance issues are detected or suspected), but only when the device is in a special administrative mode. In an embodiment, however, the device configuration logic may be capable of adjusting at least some aspects of a profile itself. For instance, if the management block 590 were to detect certain issues with the packet-switching logic 560 of one core 510a, it might dynamically adjust the device profile to re-route traffic from SerDes block 520a through interface controller block 530b, temporarily or permanently.

In an embodiment, the same auxiliary wiring 580 may be utilized for rerouting around more than just one component. Moreover, the direction that data travels along the wiring 580 may be reversed depending on exactly which components need to be routed around.

There are a variety of manners in which the device configuration logic of management block 590 may configure cores 510a and 510b to permit packet-switching functionality by the equivalent of a single core 510 when cores 510a and 510b have components that are defective or otherwise inactive. Some examples of these configurations are, without limitation, now explored.

Rerouting Around all Packet-Switching Logic

Figure 6:
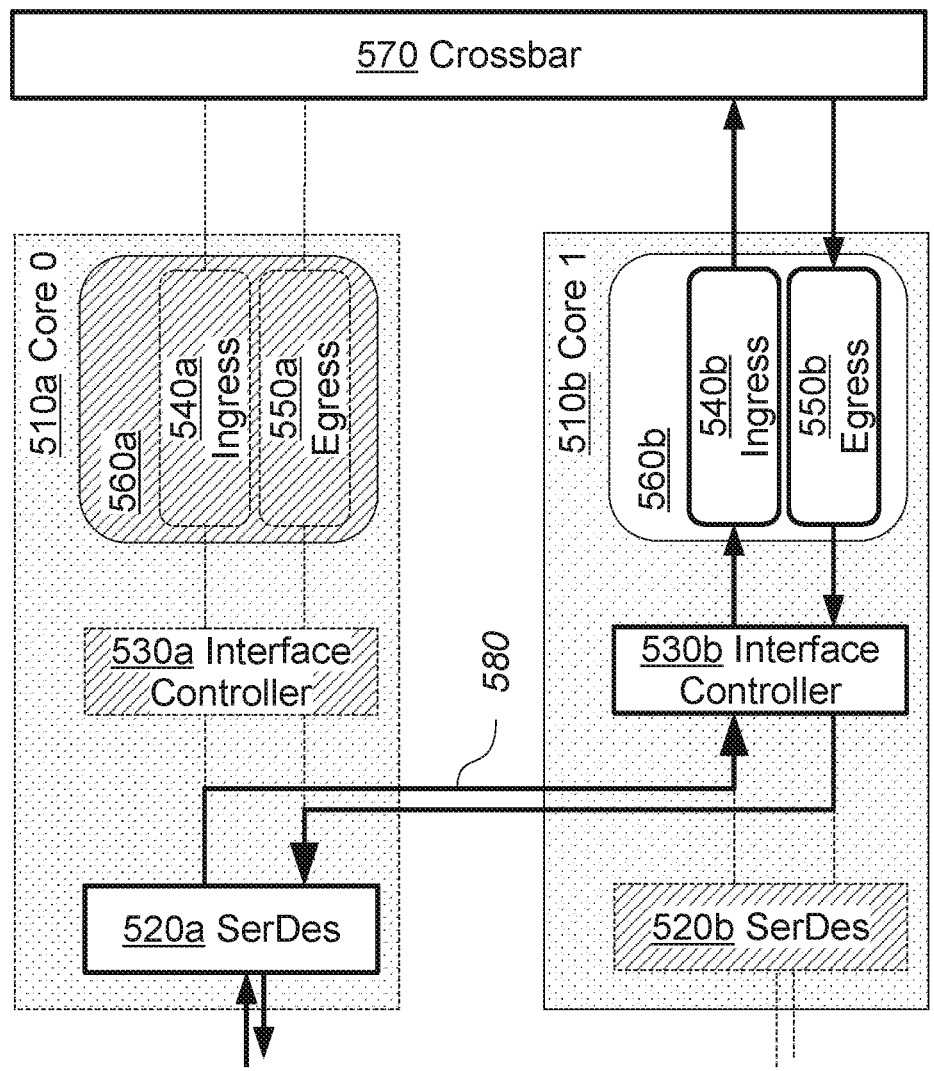
FIG. 6 illustrates an example Serializer/Deserializer ("SerDes") block of a first core configured to redirect data towards packet-switching logic in a different core via auxiliary wiring.

FIG. 6 illustrates the SerDes block 520a of core 510a configured to redirect data towards packet-switching logic 560b in core 510b via auxiliary wiring 580, according to an embodiment. Specifically, data that SerDes block 520a would normally send to interface controller block 530a of core 510a (e.g. over an outbound internal interface such as outbound internal interface 331) is being sent over the auxiliary wiring 580 to interface controller block 530b in core 510b. Similarly, data that interface controller block 530b would normally send to SerDes block 520b of core 510b (e.g. over an inbound internal interface such as inbound internal interface 332) is returned over the auxiliary wiring 580 to SerDes block 520a.

A data unit received over a channel coupled to SerDes block 520a, and destined for another channel coupled to SerDes block 520a, might thus take the following path. After arriving at a first SerDes lane in SerDes block 520a, the data unit would travel through auxiliary wiring 580 to interface controller block 530b. The data unit would then travel to ingress block 540b, crossbar 570, and egress block 550b, before returning to interface controller block 530b. The data unit would then travel from interface controller block 530b back to a different SerDes lane in SerDes block 520a, and then out to the network. Note that the path that a data unit would take from one SerDes lane on a SerDes block to another SerDes lane on the same SerDes block may hereinafter be referred to as a pipeline, and the set of components (aside from the crossbar) through which it travels are all part of the same "logical" core.

Configuring cores 510a and 510b in this manner may be desirable for a variety of reasons, depending on the embodiment. For example, SerDes block 520b may have been deactivated for defects, and one or all of interface controller block 530a, ingress block 540a, or egress block 550a may have been deactivated for defects. The configuration depicted in FIG. 6 may thus allow the two physical cores 510a and 510b to function as one logical core, whereas without auxiliary wiring 580 both cores would be inactive. As another example, SerDes block 520b may actually be operational, but the chip 500 may be intended for use with packaging and/or external circuitry that assumes that SerDes block 520a is bumped out instead of SerDes block 520a. If any one of interface controller block 530b, ingress block 540a, or egress block 550a is defective, the configuration of FIG. 6 would still permit switching of data units received over SerDes block 520a.

Or, in the foregoing examples, some or all of SerDes block 520b, interface controller block 530a, ingress block 540a, or egress block 550a may be inactive for reasons other than being defective. They may not perform at a desired performance level, for example.

As mentioned, the components that are inactive are indicated to the device configuration logic by a profile, which in turn may be pre-programmed into the chip. Hence, the reason for a component being inactive may not be known to the device configuration logic. In some embodiments, a component being inactive may thus mean simply that, as a result of the device configuration logic, the component does not receive any network data to process. In an embodiment, however, the device configuration logic may configure a chip so that some or all of its inactive components are not powered.

In yet other embodiments, some or all components considered to be inactive may nonetheless receive or even act upon data. However, the components are still considered to be inactive because they either do not act upon the data they receive, or a downstream component is configured not to act upon results of their processing. For example, in an embodiment, interface controller block 530a may still receive the same data that SerDes block 520a is sending over the auxiliary wiring 580. However, interface controller block 530a may be configured to simply discard the data, may be defective and not produce valid outputs, or may pass the data on to another component (e.g. the ingress block 540a or 550a) that is configured to discard the data or is defective. Or, the crossbar 570 could be configured to ignore data from these components, or there may be interfaces (such as an outbound ingress interface 371) that are disabled to prevent the crossbar 570 from receiving any data from these components. Similarly, SerDes 520b might still receive the same data that interface controller block 530b sends out auxiliary wiring 580, but be configured to discard that data, or simply not be bumped out to any external component that can receive the data.

Cores 510a and 510b are, effectively, acting together as a single logical core. However, even though both cores have active and inactive components, for purposes of discussion, core 510b is said to be an active core, while core 510a is considered to be inactive. This is because core 510b is configured to receive communications with the crossbar 570, and hence any other cores 510 connected to the crossbar 570 would need to send data to core 510b rather than core 510a.

Rerouting Around an Ingress Block

Figure 7:
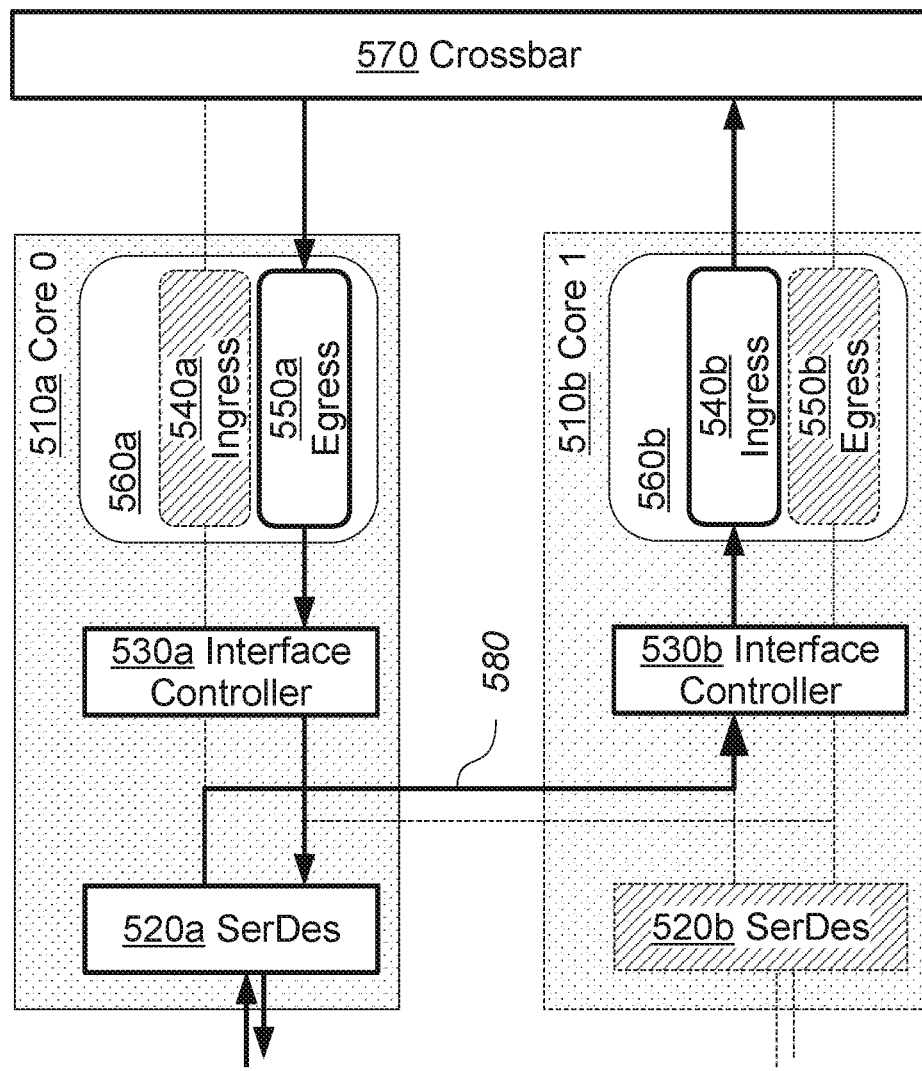
FIG. 7 illustrates an example core configured to redirect data around its ingress block and through the ingress block of another core via auxiliary wiring.

FIG. 7 illustrates core 510a configured to redirect data around its ingress block 540a and through the ingress block 540b of core 510b via auxiliary wiring 580, according to an embodiment. As in FIG. 6, data that SerDes block 520a would normally send to interface controller block 530a of core 510a is being sent over the auxiliary wiring 580 to interface controller block 530b in core 510b. The interface controller block 530b then directs this data to the ingress block 540b (e.g. via an inbound ingress interface such as inbound ingress interface 341), which then sends the data to the crossbar 570 (e.g. via an outbound ingress interface such as outbound ingress interface 371).

However, unlike in FIG. 6, the crossbar 570 is configured to send any data that is to be forwarded out of SerDes block 520a back through core 510a, meaning that core 510a is considered to be the active core in this configuration. Specifically, the crossbar 570 sends the data to egress block 550a (e.g. via an inbound egress interface such as inbound egress interface 372), which then sends the data to interface controller block 530a (e.g. via an outbound egress interface such as outbound egress interface 351). The interface controller block 530a then returns the data to SerDes block 520a (e.g. over an inbound internal interface such as inbound internal interface 332).

Further note that, as a consequence of this configuration, the auxiliary wiring 580 is only used in one direction. In fact, in an embodiment, there may only be sufficient auxiliary wiring 580 to communicate in one direction, meaning the configuration of FIG. 7 would be viable whereas the configuration of FIG. 6 would not.

A data unit received over a channel coupled to SerDes block 520a, and destined for another channel coupled to SerDes block 520a, might thus take the following path. After arriving at a first SerDes lane in SerDes block 520a, the data unit would travel through auxiliary wiring 580 to interface controller block 530b. The data unit would then travel to ingress block 540b, crossbar 570, egress block 550a, and interface controller block 530a. The data unit would then travel from interface controller block 530a back to a different SerDes lane in SerDes block 520a, and then out to the network.

Configuring cores 510a and 510b in this manner may be desirable for a variety of reasons, depending on the embodiment. For example, ingress block 540a may be inactive for defects or other reasons. If egress block 550b or SerDes block 520b is likewise inactive, the configuration depicted in FIG. 7 may thus allow the two physical cores 510a and 510b to function as one logical core, whereas without auxiliary wiring 580 both cores would be inactive. Even if core 510b is entirely functional, the configuration of FIG. 7 may be useful if it is preferred to bump out SerDes block 520a instead of SerDes block 520b, but ingress block 540a is defective or otherwise inactive.

Rerouting Around an Egress Block

Figure 8:
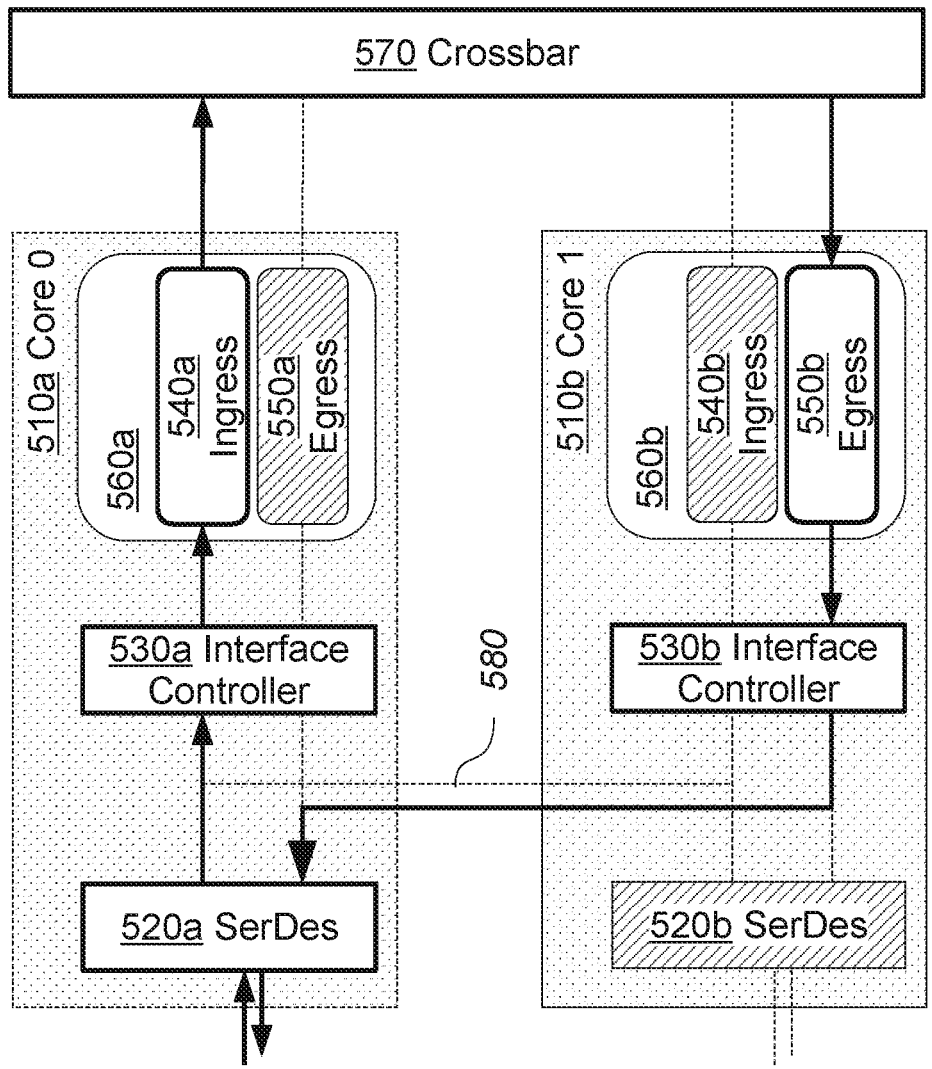
FIG. 8 illustrates an example core configured to redirect data around its egress block and through the egress block of another core via auxiliary wiring.

FIG. 8 illustrates core 510a configured to redirect data around its egress block 550a and through the egress block 550b of core 510b via auxiliary wiring 580, according to an embodiment. SerDes block 520a is configured to send data to interface controller block 530a as it normally would. Likewise, interface controller block 530a is configured to direct this data to the ingress block 540a, which then sends the data to the crossbar 570.

However, rather than returning the data back through core 510b, the crossbar 570 is configured to send any data that is to be forwarded out of SerDes block 520a back through core 510b, meaning that core 510b is considered to be the active core in this configuration. Specifically, the crossbar 570 sends the data to egress block 550b, which then sends the data to interface controller block 530b. The interface controller block 530b then returns the data to SerDes block 520a via the auxiliary wiring 580. Again, as a consequence of this configuration, the auxiliary wiring 580 is only used in one direction.

A data unit received over a channel coupled to SerDes block 520a, and destined for another channel coupled to SerDes block 520a, might thus take the following path. After arriving at a first SerDes lane in SerDes block 520a, the data unit would travel to ingress block 540a, crossbar 570, egress block 550b, and interface controller block 530b. The data unit would then travel from interface controller block 530b through auxiliary wiring 580 to a different SerDes lane in SerDes block 520a, and then out to the network.

Configuring cores 510a and 510b in this manner may be desirable for a variety of reasons, depending on the embodiment. For example, egress block 550a may be inactive for defects or other reasons. If ingress block 540b or SerDes block 520b is likewise inactive, the configuration depicted in FIG. 7 may thus allow the two physical cores 510a and 510b to function as one logical core, whereas without auxiliary wiring 580 both cores would be inactive. Even if core 510b is entirely functional, the configuration of FIG. 7 may be useful if it is preferred to bump out SerDes block 520a instead of SerDes block 520b, but egress block 550a is defective or otherwise inactive.

Figure 9:
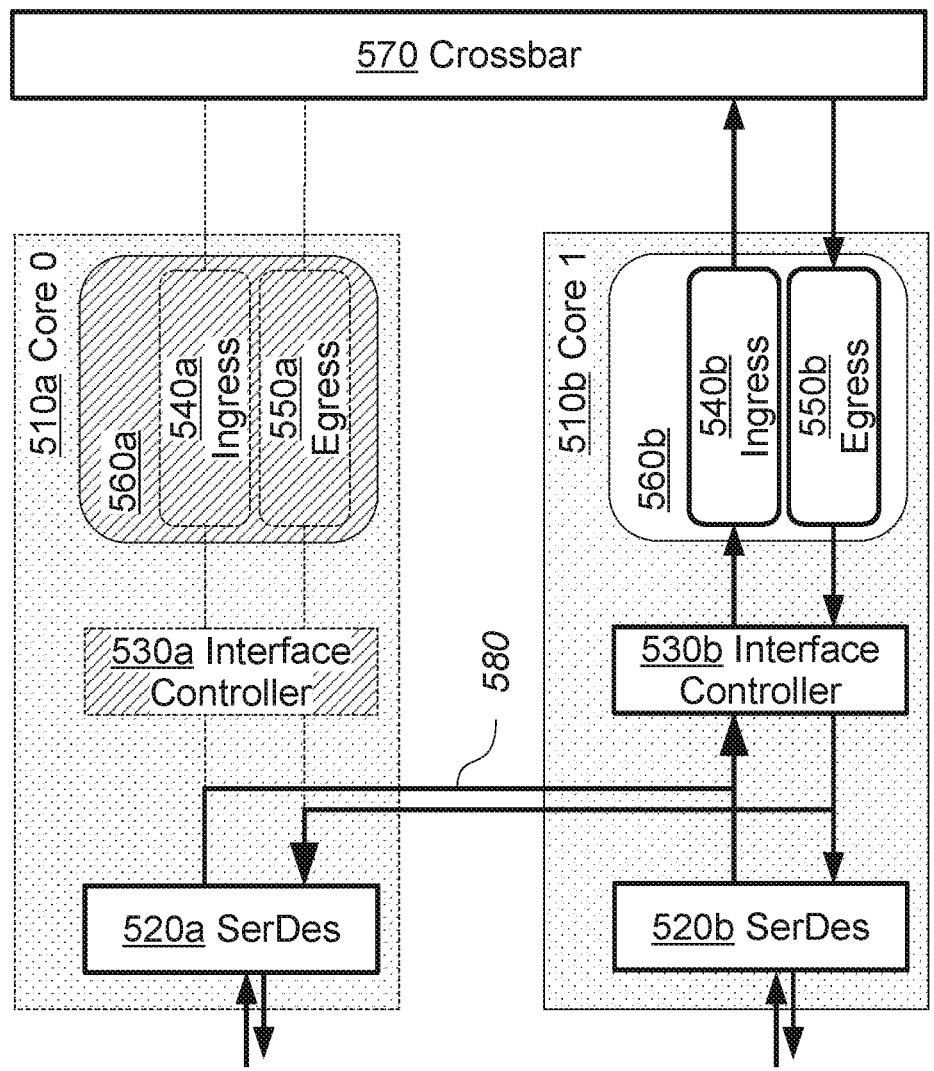
FIG. 9 illustrates an example core configured to accept data from both its own SerDes block and the SerDes block of another core via auxiliary wiring.

Rerouting Around Packet-Switching Logic without Reducing Active SerDes Lanes FIG. 9 illustrates core 510b configured to accept data from both its own SerDes block 520b and SerDes block 520a of core 510a via auxiliary wiring, according to an embodiment. Like in FIG. 6, data from SerDes block 520a is redirected via auxiliary wiring 580 to interface controller block 530b, and interface controller block 530b is configured to route any data intended for SerDes block 520a back through the auxiliary wiring 580. However, interface controller block 530b is also configured to receive from and send to its own SerDes block 520b. Depending on the embodiment, SerDes blocks 520 may be configured to recognize and ignore data not for them. Or, the auxiliary wiring 580 may be configured in such a manner that interface controller block 530b can direct data to one SerDes block 520 but not the other depending on the destination of that data.

As a result, core 510b is configured to process data from up to twice the normal number of SerDes lanes. However, with only a single interface controller block 530b and packet-switching logic 560b, each lane will have effectively half the speed it would otherwise have. For example, if core 510a is not operational, core 510b has a bandwidth of 400 GB/s bandwidth, and each SerDes block 520 has four lanes, then under the example configurations previously considered, there would be only four operational lanes, and each of those four lanes would have a speed of 100 GB/s. However, using the configuration depicted in FIG. 9, four lanes from SerDes block 520a are also directed to core 510b, and there are instead eight operational lanes. However, each of those lanes may be limited to 50 GB/s. This compromise may nonetheless be acceptable in certain contexts where many connections are needed at lower speeds than provided by a fully-functional chip.

Miscellaneous

Chip 500 is but one example of a multi-core chip with auxiliary wiring. Other such chips may include additional and/or fewer components in varying arrangements. For instance, the auxiliary wiring may be deployed in other manners, such as between the interface controller block 530 and forwarding logic 560 in certain embodiments. In an embodiment, the auxiliary wiring 580 may be only between one pair of cores, such as between core 510a and 510b, but not the other.

In an embodiment, there may be additional auxiliary wiring 580 between different components of chip 500. For example, instead of relying on the same auxiliary wiring 580 to route around different types of components in a core 510, there may be dedicated auxiliary wiring 580 for some or all of the components in a core 510. For instance, there may be dedicated auxiliary wiring 580 between pairs of ingress blocks 540 or between pairs of egress blocks 550.

In an embodiment, packet-switching logic 560 need not be divided into distinct ingress blocks 540 and egress blocks 550.

Note that the example configurations above may be used to provide a three-core working configuration of chip 500 if both cores 510c and 510d are operational, a two-core working configuration for chip 500 if only one of cores 510c or 510d are active, or a single-core working configuration for chip 500 if both cores 510c and 510d are inactive.

Moreover, while the configurations are illustrated with respect to cores 510a and 510b, the configurations may similarly be used for cores 510c and 510d, if those cores also have certain defective or otherwise inactive components, so as to provide a two-core working configuration for chip 500.

Moreover, in other embodiments, there may be any number of cores 510, such as eight, sixteen, two, and so forth. The techniques described above may be utilized to form a single working logical core from any pair of cores 510 connected by auxiliary wiring 580 in any multi-core chip, regardless of the number of physical cores 510 in that chip.

2.6. Auxiliary Wiring to Multiple Cores

Figure 10:
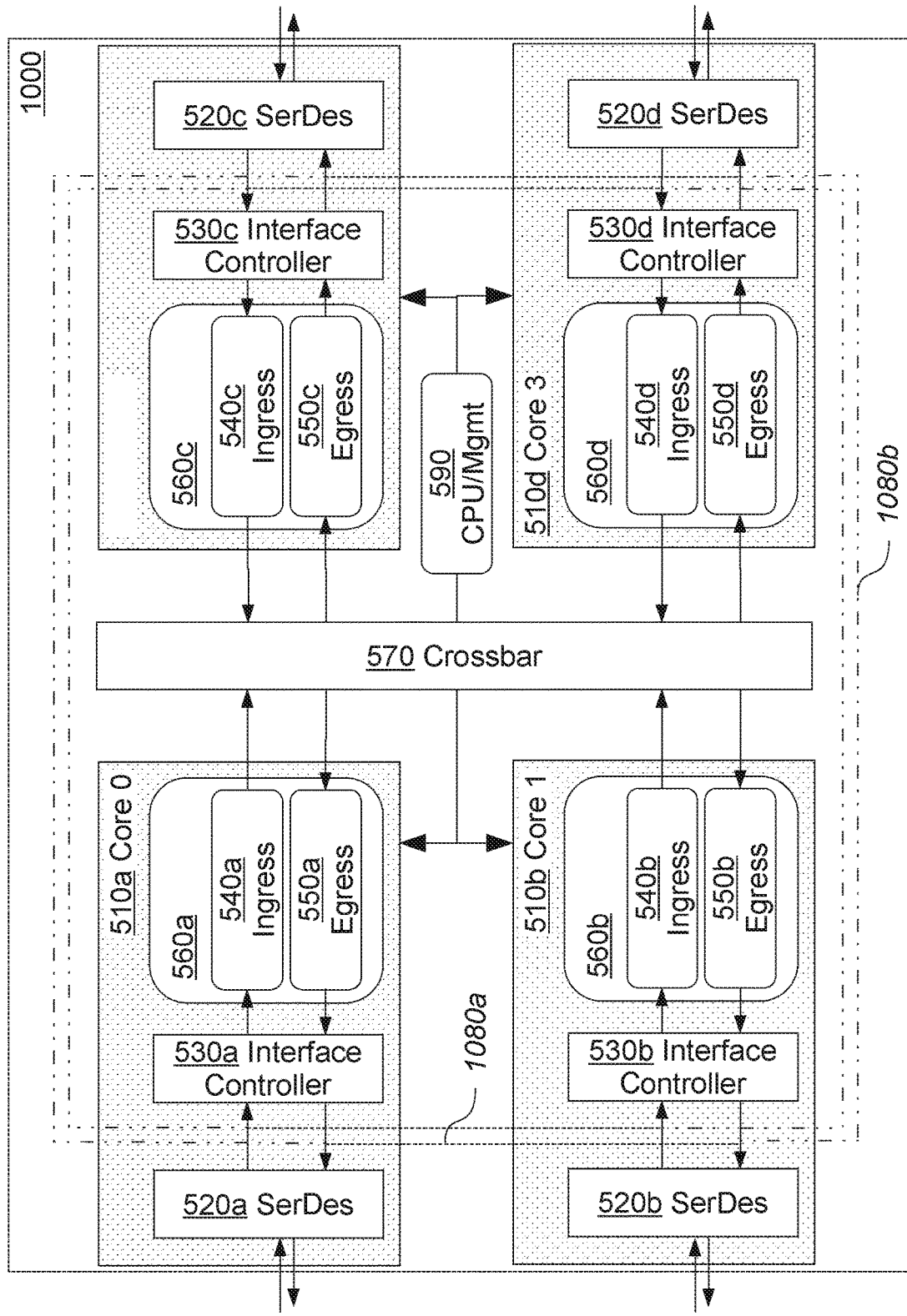
FIG. 10 illustrates an example multi-core chip with auxiliary wiring that couples each core to two adjacent cores.

As mentioned, multi-core chips may have additional auxiliary wiring beyond that depicted in chip 500. For example, FIG. 10 illustrates an example multi-core chip 1000 with auxiliary wiring 1080 that couples each core 510 to two adjacent cores 510, according to an embodiment.

Chip 1000 has primarily the same components as chip 500. However, auxiliary wiring 580 has been replaced by auxiliary wiring 1080a between each core 510 and the core situated across from it vertically, and auxiliary wiring 1080b has been added between each core 510 and the core 510 situated across from it horizontally. Hence, auxiliary wiring 1080 couples each core 510 with two other cores 510, which in the depicted embodiment at least are the two closest (adjacent) cores 510.

Auxiliary wiring 1080 is used in much the same manner as auxiliary wiring 580. For instance, auxiliary wiring 1080a may be used in the exact same manner as auxiliary wiring 580 in FIGS. 6-9. Auxiliary wiring 1080b, meanwhile, is effectively the same as auxiliary wiring 1080a, but used to redirect data to and from a different core than auxiliary wiring 1080a.

The addition of auxiliary wiring 1080b is optional, depending on the embodiment, but allows for yet greater flexibility. For instance, if ingress blocks 540a and 540b were both defective, such that auxiliary wiring 1080a could not be used to route data from SerDes block 520b to a functioning ingress block 540, core 510b could still be activated by using auxiliary wiring 1080b to divert data through ingress block 540c.

Again, there are a variety of manners in which the device configuration logic of management block 590 may configure cores 510 to permit packet-switching functionality when certain cores 510 have components that are defective or otherwise inactive. Some examples of these configurations are, without limitation, now explored.

FIGS. 11A-F illustrate example configurations of chip 500 with three or more at least partially inactive cores 510 that take advantage of auxiliary wiring to provide the equivalent of two working cores 510, according to an embodiment.

Figure 11A:
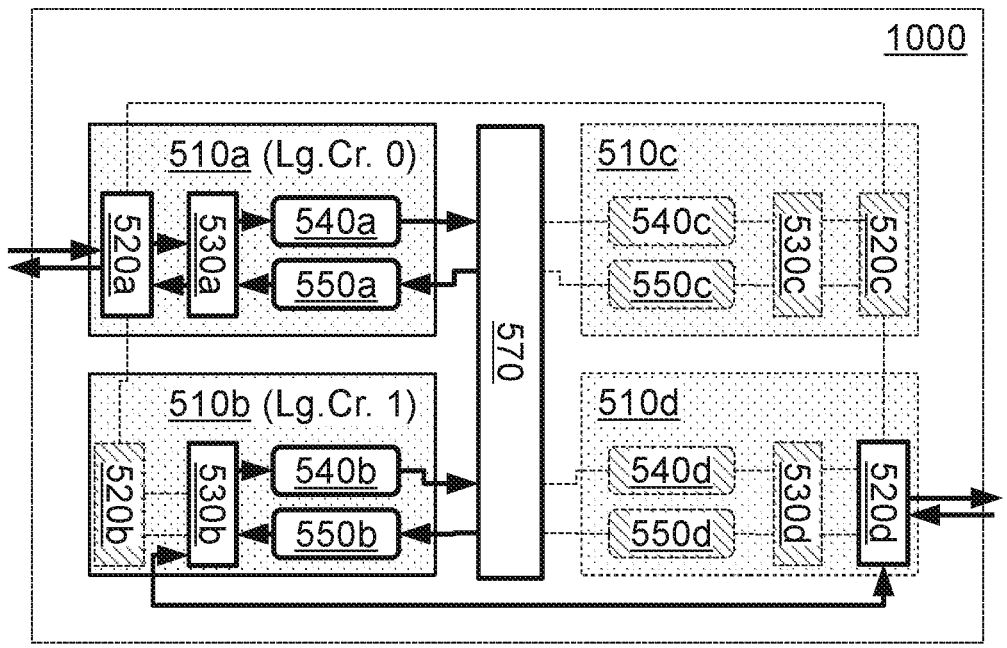
FIGS. 11A-F illustrate example configurations of a multi-core chip with three or more at least partially inactive cores that take advantage of auxiliary wiring to provide the equivalent of two working cores.

In FIG. 11A, core 510a is fully functional and bumped out. However, there are defects in cores 510b-510d. SerDes block 520d of core 510d has thus been bumped out and configured to route data to interface controller block 530b of core 510b. The ingress block 540b and egress block 550b implement packet-switching, and interface controller block 530b returns data back to SerDes block 520d. In this manner, a second working core is provided, capable of switching network traffic to or from devices that are connected to SerDes block 520d.

Figure 11B:
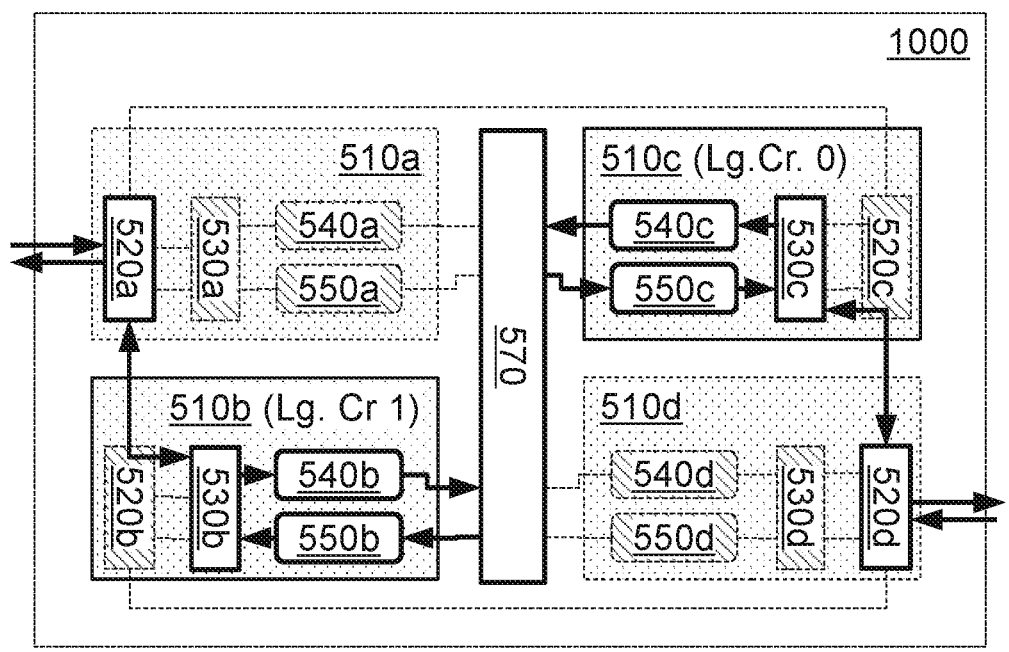
Figure 11C:
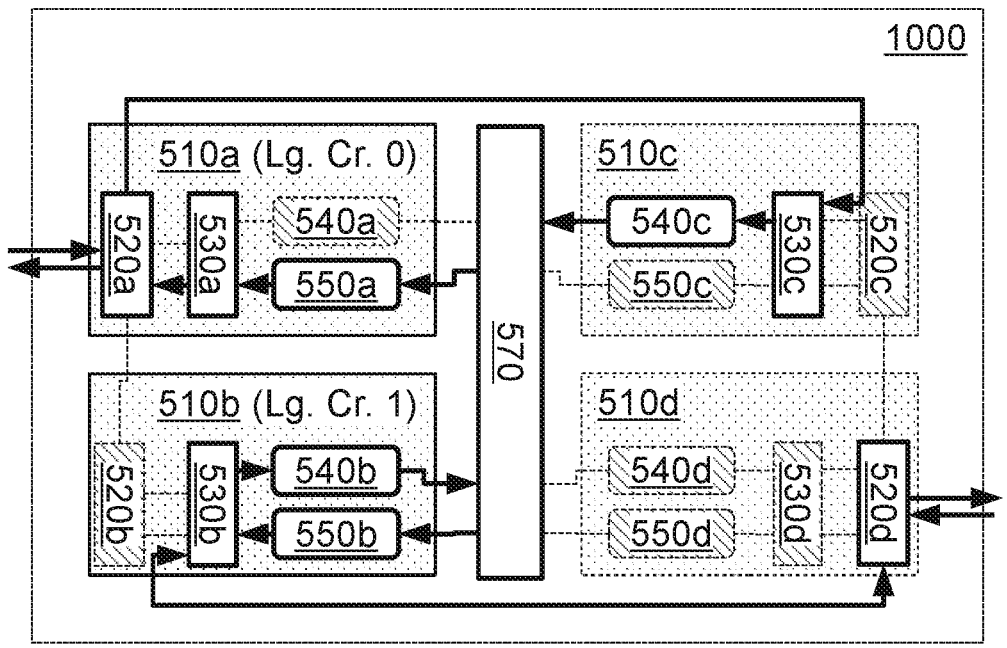
Figure 11D:
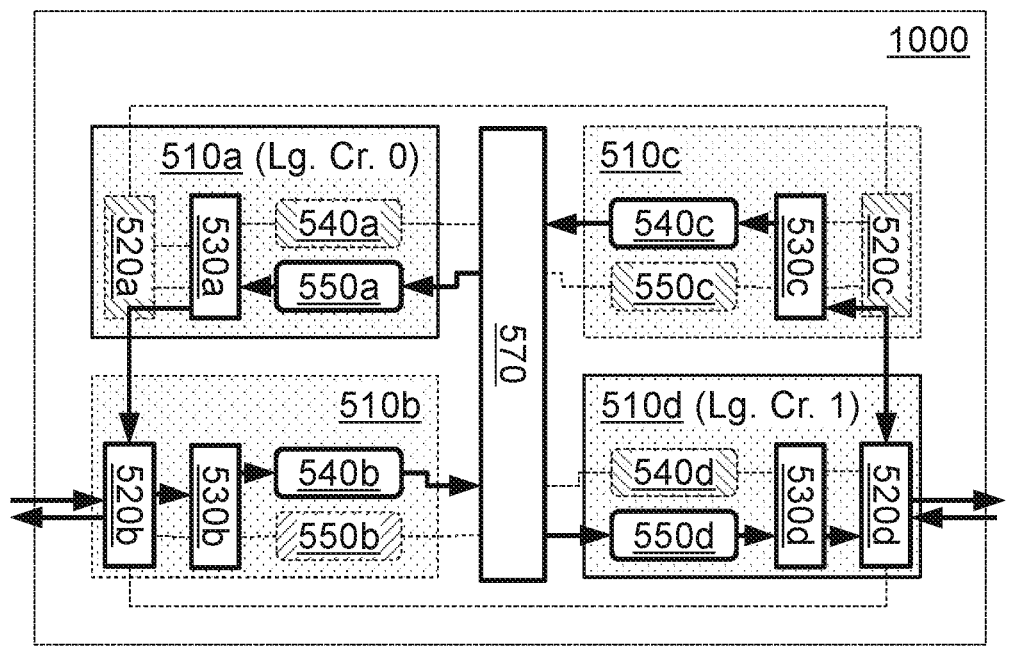

In FIG. 11B, no core 510 is fully functional. A first working logical core is provided via cores 510a and 510b, in similar manner to that shown in FIG. 6. That is, the SerDes block 520a of core 510a has been bumped out and configured to route data to interface controller block 530b of core 510*b*. The ingress block 540*b* and egress block 550*b* implement packet-switching, and interface controller block 530*b* returns data back to SerDes block 520*a*. A second working logical core is provided via cores 510*c* and 510*d*. SerDes block 520*d* of core 510*d* has been bumped out and configured to route data to interface controller block 530*c* of core 510*c*. The ingress block 540*c* and egress block 550*c* implement packet-switching, and interface controller block 530*c* returns data back to SerDes block 520*d*.

In FIG. 11C, again, no core 510 is fully functional. A first working logical core is this time provided via cores 510*a* and 510*c*, which are configured to route around a defect in ingress block 540*a*. SerDes block 520*a* of core 510*a* has been bumped out and configured to route data through interface controller block 530*c* to ingress block 540*c* and on to the crossbar 570. However, data destined to depart from SerDes block 520*a* is routed back to core 510*a* via egress block 550*a*, and the interface controller block 530*a* returns this data to SerDes block 520*a*. A second working logical core is provided via cores 510*c* and 510*d*, in the same manner as depicted in FIG. 11A.

In FIG. 11D, again, no core 510 is fully functional, and a first working logical core is again provided via cores 510*a* and 510*b*. However, this time cores 510*a* and 510*b* are configured to route around a defect in egress block 550*b*. SerDes block 520*b* of core 510*b* has been bumped out and configured to route data through interface controller block 530*b* to ingress block 540*b* and on to the crossbar 570. However, data destined to depart from SerDes block 520*b* is routed through egress block 550*a* of core 510*a*, and the interface controller block 530*a* returns this data to SerDes block 520*b* of core 510*b*. A second working logical core is provided via cores 510*c* and 510*d*, which are configured to work around a defect in ingress block 540*d*. SerDes block 520*d* of core 510*d* has been bumped out and configured to route data to interface controller block 530*c* of core 510*c*. The ingress block 540*c* processes the data and sends the data to crossbar 570. Data destined to depart from SerDes block 520*d* is routed through egress block 550*d* of core 510*d*, and the interface controller block 530*d* returns this data to SerDes block 520*d*.

Figure 11E:
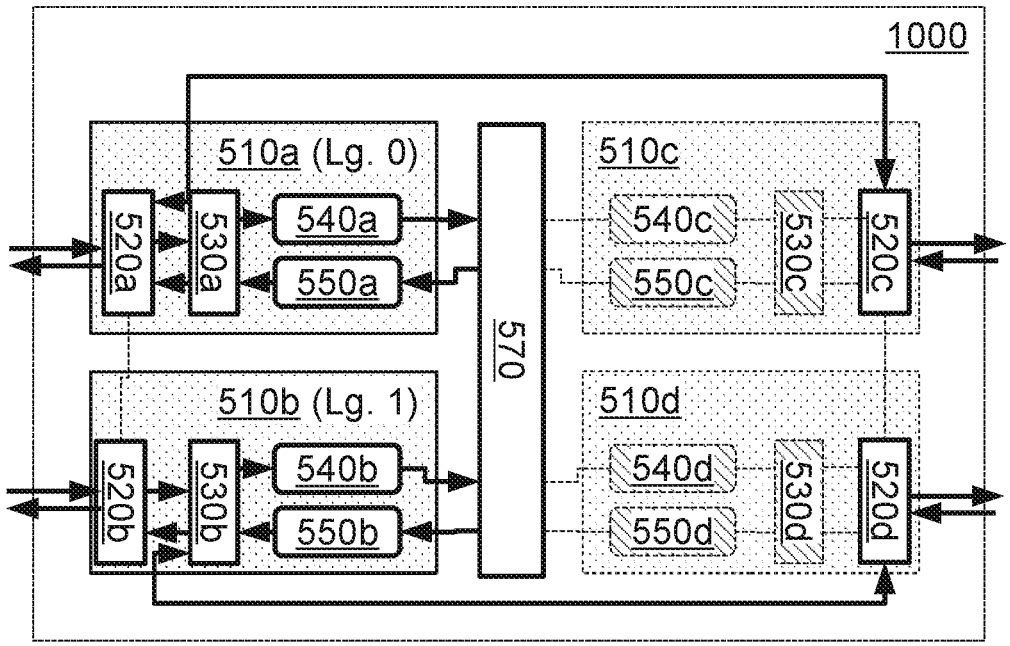

In FIG. 11E, there are actually two fully functional cores 510*a* and 510*b*, both of whose SerDes blocks 520 have been bumped out. Blocks 510*c* and 510*d* are defective or otherwise inactive, but have working SerDes blocks 520 that have also been bumped out. Data to and from these SerDes blocks 520*c* and 520*d* are thus redirected through cores 510*a* and 510*b*, respectively, by the appropriate auxiliary wiring 1080*b*, to provide a chip 1000 in which all SerDes lanes are operational, but with half the bandwidth of a full-functioning chip 1000.

Figure 11F:
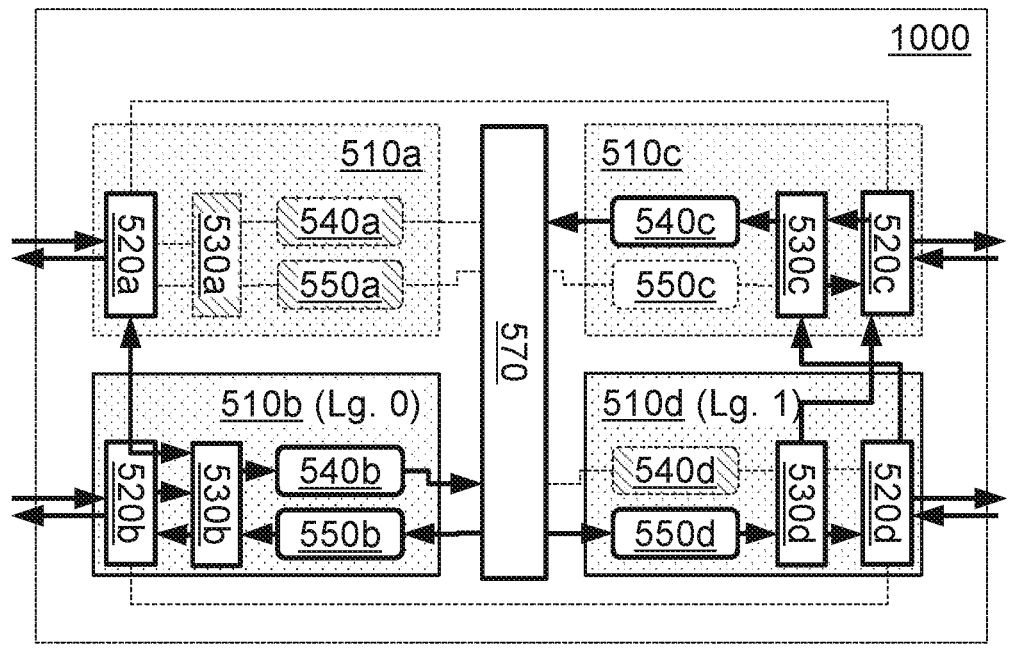

A similar result is possible with the configuration of FIG. 11F. In FIG. 11F, only core 510*b* is full functional. SerDes block 520*a* still works, but the remainder of core 510*a* is inactive, so SerDes block 520*a* is routed through core 510*b*. Meanwhile, egress block 550*c* and ingress block 540*d* are defective. Data coming in on SerDes blocks 520*c* and 520*d* are thus passed to interface controller block 530*c* so that the data may be forwarded to ingress block 540*c* for ingress processing. The crossbar 570, meanwhile, forwards all data destined for SerDes blocks 520*c* and 520*d* to egress block 550*d* for egress processing. Interface controller block 530*d* then forwards data to SerDes block 520*c* or SerDes block 520*d*, as appropriate.

Miscellaneous

Chip 1000 is another example of a multi-core chip with auxiliary wiring. Other such chips may include fewer or additional components in varying arrangements. For example, in an embodiment, there may be auxiliary wiring between all three cores, or even more cores if the chip includes more cores. However, in some embodiments, configurations under which additional working cores could be realized through additional wiring beyond the wiring in chip 1000 may not be likely or valuable enough to warrant the usage of additional wafer area for the additional wiring.

In an embodiment, a single working core may be configured from three physical cores. A SerDes block of the first physical core may be redirected towards the ingress block of a second physical core via first auxiliary wiring. Data destined for the SerDes block of the first physical core may be forwarded out the egress block of a third physical core and returned to the SerDes block of the first physical core via second auxiliary wiring.

In an embodiment, data from three SerDes blocks 520 may be serviced by the packet switching logic of a single core 510 via auxiliary wiring 1080, at a third of the bandwidth that would be available if all three cores were fully functional. Of course, ff additional auxiliary wiring is provided, additional SerDes blocks could be connected in similar manner.

Depending on how the auxiliary wiring is arranged, not all example configurations given above may be possible. For example, the wiring may be deployed at different locations that make some configurations impossible. Or, there may only be sufficient auxiliary wiring for transferring data away from a certain core, but not back to that core, thus making certain configurations impossible.

2.7. Repurposing Buffer and Other Resources from Inactive Cores

Figure 12:
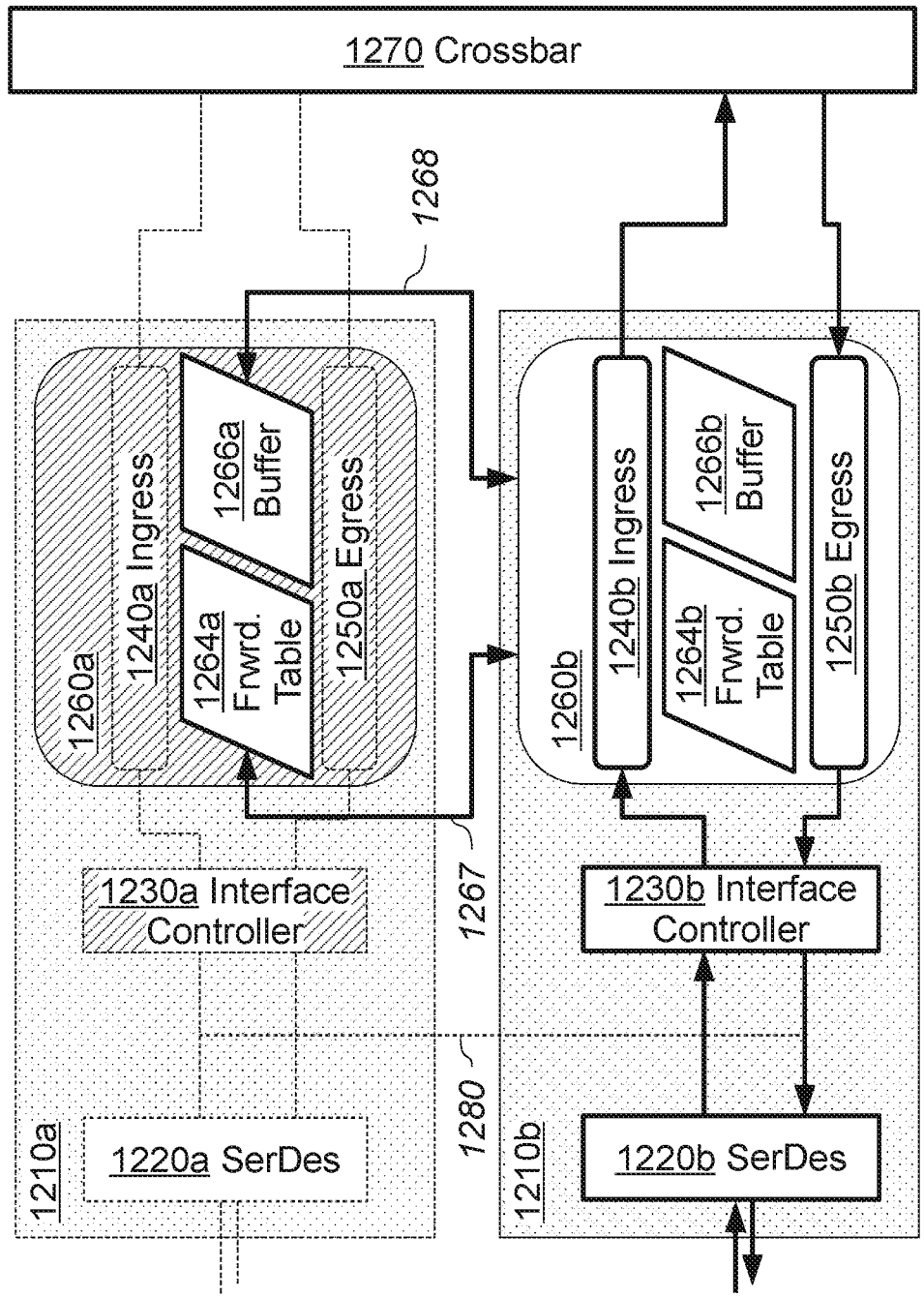
FIG. 12 illustrates an active core that has been configured to utilize a forwarding table and buffer from an inactive core.

According to an embodiment, even if components of an inactive core are not needed for handling data units directly, resources of an inactive core may optionally be used to increase the resources available to an active core. For instance, FIG. 12 illustrates an active core 1210*b* that has been configured to utilize a forwarding table 1264*a* and buffer 1266*a* from an inactive core 1210*a*, according to an embodiment.

Cores 1210*a* and 1210*b* are similar to cores 510 in FIG. 5. Each includes a SerDes block 1220, interface controller block 1230, packet-switching logic 1260, ingress block 1240, and egress block 1250, similar to SerDes block 520, interface controller block 530, packet-switching logic 560, ingress block 540, and egress block 550. The cores 1210 are connected by a crossbar 1270, similar to crossbar 570, and which may be connected to any other number of cores 1210. There is also auxiliary wiring 1280 between cores 1210*a* and 1210*b*, similar to auxiliary wiring 580. SerDes block 1220*b* of core 1210*b* is bumped out, and all components of core 1210*b* are active for processing data.

In both cores, the packet-switching logic 1260 includes or is coupled to its own forwarding table 1264 and buffer 1266. The amount of buffer space and forwarding table space available to the packet-switching logic can be a significant limiting factor in the performance of a network chip, depending on the environment in which the network chip is deployed.

The forwarding table 1264 may be, for example, a table that maps addresses (or ranges of addresses) to specific destinations (e.g. ports or queues) and/or forwarding policies. Forwarding logic within ingress block 1240 may use forwarding table 1264, for instance, to determine where to send a data unit. In an embodiment, the forwarding table 1264 may be part of the ingress block 1240, though in other embodiments the forwarding table 1264 may reside outside the ingress block 1240.

Buffer 1266, meanwhile, is one or more memories in which egress block 1250 and/or ingress block 1240 may be configured to temporarily store data units that are awaiting processing. In an embodiment, the buffer 1266 may be part of the egress block 1250 or ingress block 1240, or external to these blocks. In some embodiments, each block 1240 and 1250 may have its own buffer 1266.

In an embodiment, auxiliary wiring may permit packet-switching logic 1260b to access the forwarding table 1264a and/or buffer 1266a of core 1210a, even if the packet-switching logic 1260a of that core 1210a is not active. Specifically, there may be wiring 1267 by which packet-switching logic 1260b may read from and write to forwarding table 1264a and/or wiring 1268 by which packet-switching logic 1260b may read from and write to buffer 1266a. This wiring 1267/1268 may be separate from, or the same as, auxiliary wiring 1280, depending on the embodiment.

In this manner, if forwarding table 1624a and/or buffer 1266a are not defective, the amount of forwarding table and/or buffer space available to packet-switching logic 1260b may be essentially doubled. To facilitate use of these resources, a management block may be configured to signal to packet-switching logic 1260b, or ingress block 1240b or egress block 1250b specifically, when the components are permitted to utilize the resources from core 1210a. Moreover, forwarding logic may be configured to include a mechanism in its forwarding table addressing scheme to resolve whether a specific forwarding table entry is in forwarding table 1264a or 1264b. Buffering logic may similarly be configured to include a mechanism in its buffer addressing schemes to resolve whether a specific entry is in buffer 1266a or 1266b.

FIG. 12 illustrates only one manner in which resources from an inactive core may be re-purposed for use by an active core. In other embodiments, there may be different sets of resources available for re-purposing via different wiring. For instance, only one of forwarding table 1264 and buffer 1266 might be made available to another core. Or, there may be multiple buffers or other memories used by the packet-switching logic 1260 (e.g. an ingress buffer and an egress buffer, a linking memory, etc.), some or all of which may be available to other cores. Or, individual traffic managers or packet processors from an inactive core may be used by an adjacent active core, in an embodiment.

In an embodiment, an active core may be configured to utilize resources from an inactive core in place of its own resources. For example, core 1210b may be configured to utilize forwarding table 1264a and/or buffer 1266a in place of forwarding table 1264b and/or buffer 1266b if forwarding table 1264b and/or buffer 1266b were defective or suffered from performance issues.

In an embodiment, certain resources from both cores may be utilized in arrangements such as depicted in FIGS. 6-9 and 11A-11F. For instance, in FIGS. 6-9, ingress block 540b or egress block 550b from core 510b may be configured to utilize a buffer or forwarding table from core 510a, or vice versa.

2.8. Logical Cores

For various reasons, components within a multi-core chip such as chip 500 or 1000 may need to reference specific cores. For instance, forwarding logic in an ingress block may need to indicate which physical core(s) a crossbar should send a data unit to. Or, a management block may need to track data associated with the cores so that it can send certain types of instructions to the cores based on that data. A physical reference scheme may thus exist whereby each core is assigned a physical core identifier.

However, in the foregoing architectures, additional considerations must be made when determining where to send a data unit or message. For instance, if a forwarding table indicates that a data unit should depart from SerDes block 520d, the forwarding logic would need to determine whether egress block 520d were actually handling data for SerDes block 520d, or if the data unit should instead be sent to another egress block that had assumed responsibility for egress processing of data destined for 520d. Similarly, if a management block is basing decisions for issuing instructions to a core's ingress block based on resource consumption at the core's egress block, the management block would need to actually determine whether the functions of that ingress block had been offloaded to the ingress block of a different core.

To reduce the complexity of such logic, in some embodiments, various components of a chip may be configured, for internal purposes, to work at a higher level of abstraction, in which they view the chip as having logical cores rather than physical cores. Each logical core consists of a pipeline of components configured to work together to provide the functionality of a physical core. Each logical core includes a SerDes block and packet-switching logic, or an individual ingress block and egress block in its place, depending on the embodiment. These components may be from the same physical core, in the case of a fully functioning core, or from two or even three different physical cores, depending on the configuration. Mapping logic may then use the device profile to translate the logical view into the underlying physical components when necessary for purposes such as determining the physical component to actually send data to.

Hence, for example, a forwarding table might simply indicate that a data unit is to be forwarded to port two of logical core one. When it came time to actually send the data unit to "logical core one," mapping logic at the crossbar or another suitable location would resolve the physical identity of the egress block for logical core one based on the device profile. Similarly, a management block might simply track resource consumption for the egress block of logical core zero, and then rely upon mapping logic to translate the logical core identifier to a physical core identifier if it ever needed to send a message related to that tracking to the ingress block or any other component of logical core zero.

Figure 13:
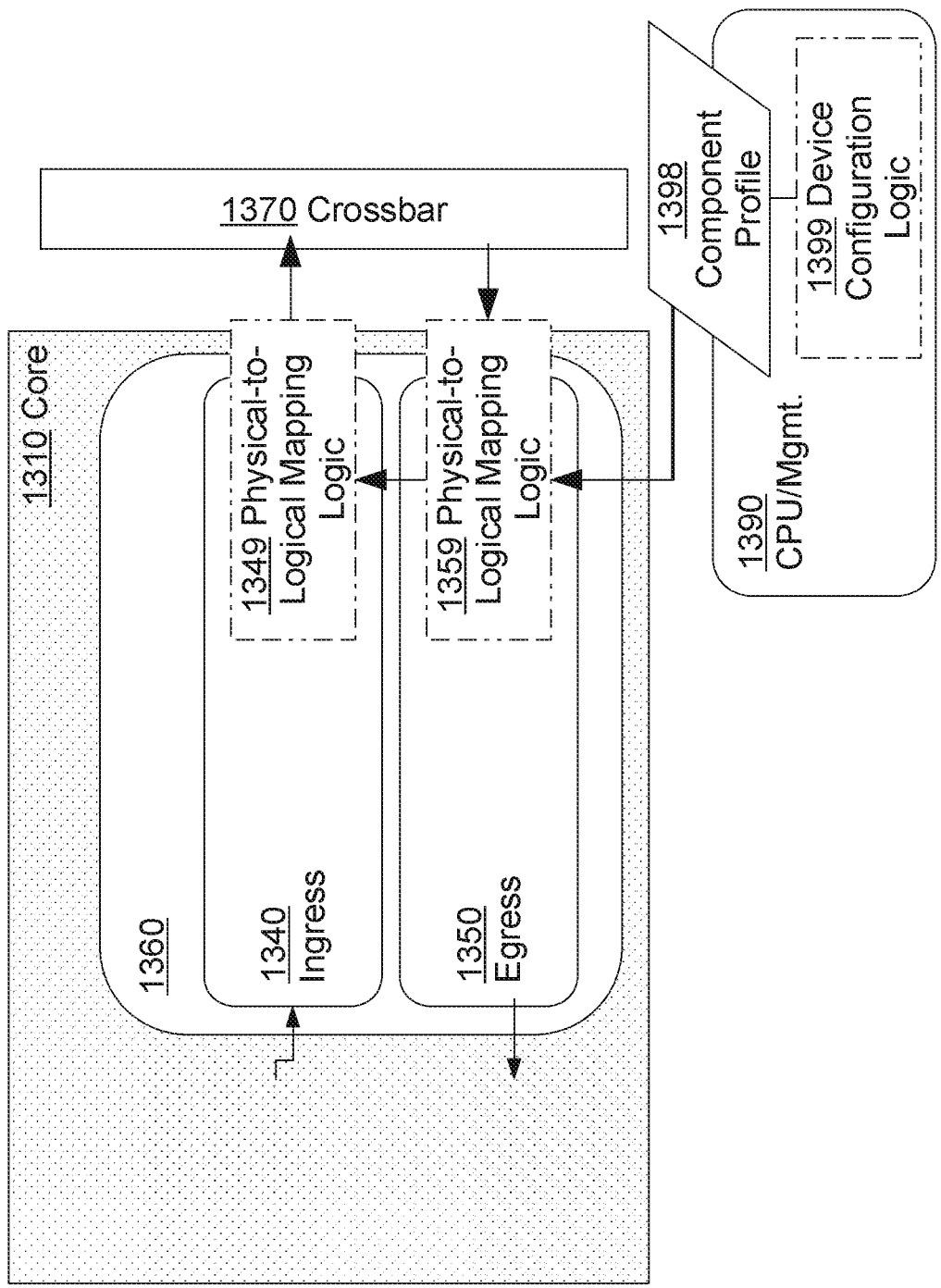
FIG. 13 illustrates a core configured to utilize logical core mapping logics.

FIG. 13 illustrates a core 1310 configured to utilize logical core mapping logics, according to an embodiment. Core 1310 includes a packet-switching logic 1360 having an ingress block 1340 and an egress block 1350. Ingress block 1340 includes, or is coupled to, a logical mapping logic 1349 configured to translate a logical core identifier to a physical core identifier. Similarly, egress block 1359 includes, or is coupled to, a logical mapping logic 1358 configured to translate a physical core identifier to a logical core identifier.

A management block 1390 includes device configuration logic 1399 that configures the mapping logics 1349/1359 based on a device profile 1398. The mapping logics 1349 may be configured, for instance, to convert logical core identifiers to physical core identifiers in forwarding instructions coming out of ingress block 1340, and vice versa coming into egress block 1350.

FIG. 13 illustrates only one manner in which logical core mapping may be implemented. For instance, in an embodiment, mapping logic may be placed directly in the crossbar 1370. Moreover, in an embodiment, the management block 1390 may include its own mapping logic.

2.9. Example Auxiliary Wiring Scheme

Figure 14:
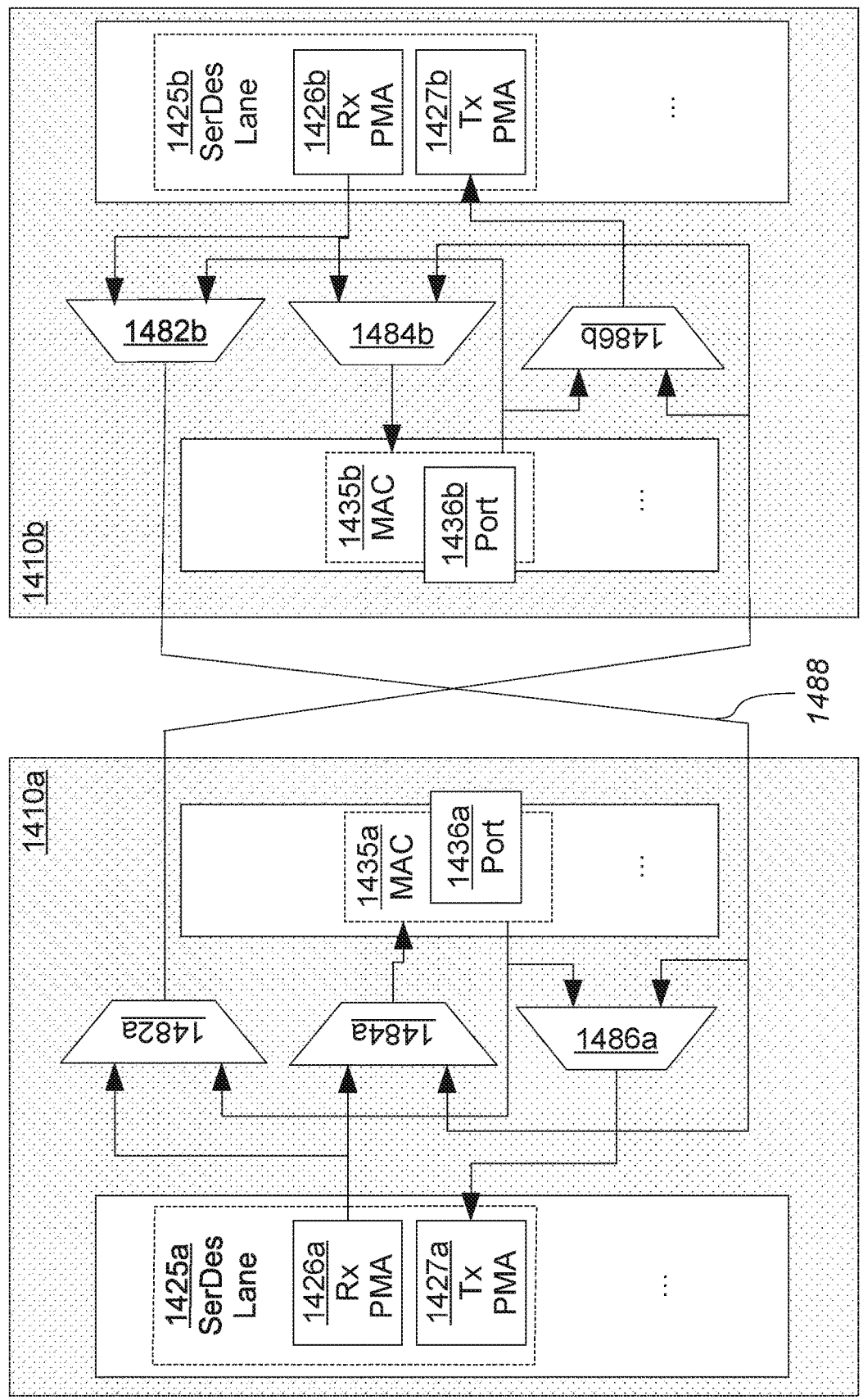
FIG. 14 illustrates an example configuration for auxiliary wiring between two cores.

FIG. 14 illustrates an example configuration for auxiliary wiring between two cores 1410, according to an embodiment. The example configuration illustrates one manner in which auxiliary wiring 580 and 1080 may be implemented, though many other configurations are possible.

Cores 1410, including cores 1410a and 1410b, each include a SerDes lane 1425, depicted as SerDes lanes 1425a and 1425b, respectively. Each SerDes lane 1425 comprises, among other components, a PMA receiver 1426 and PMA transmitter 1427. The PMA receiver 1426 receives data from a coupled channel via an external interface and relays that data downstream, potentially via one or more other components of the SerDes lane 1425, such as a serializer, PCS sublayer, and so forth. The PMA transmitter 1427 receives data from an internal interface, potentially via one or more other components such as a deserializer, PCS sublayer, and so forth, and transmits that data back to the coupled channel. As described in other sections, the data may undergo various processing as it travels through the SerDes lane 1425. In an embodiment, SerDes lane 1425 is an example of SerDes lane 325.

Cores 1410 also each include a MAC block 1435. MAC block 1435 is configured to receive data from a SerDes lane 1425, either directly or via one or more intermediary components, and prepares that data for consumption by undepicted packet-switching logic (e.g. an ingress block) of the core 1410. MAC block 1425 is further configured to receive data from packet-switching logic (e.g. an egress block) of the core 1410, and return that data to a SerDes lane 1425, again either directly or via one or more intermediary components. MAC block 1425 includes a port 1436 for interfacing with the packet-switching logic, and may in fact include any number of such ports 1436.

The wiring between the SerDes lane 1425 and MAC block 1435 of each core 1410 is configured so that, when needed, data to or from SerDes lane 1425a of core 1410a may be routed through MAC block 1435b of core 1410b, and data to or from SerDes lane 1425b of core 1410b may be routed through MAC block 1435a of core 1410a. Specifically, each core 1410 includes a series of muxes 1482-1486 in the wiring between each SerDes lane 1425 and its corresponding MAC block 1435. These muxes 1482-1486 switch between different inputs, depending on how they are configured by device configuration logic (e.g. by a signal bit received from the device configuration logic).

The inputs into mux 1482 are the data sent upstream by the PMA receiver 1426, and the data sent downstream by the MAC block 1435. Depending on how the device configuration logic configures the mux 1482, mux 1482 is configured to output one of these two inputs to the mux 1484 of the other core 1410, via inter-core cross-wiring 1488.

The inputs into mux 1484 are the data sent by the mux 1484 of the other core 1410, and again the data sent upstream by the PMA receiver 1426. Depending on how the device configuration logic configures the mux 1484, mux 1484 is configured to output one of these two inputs downstream to the MAC block 1435.

The inputs into mux 1486 are the data sent downstream by the MAC block 1435, or the data sent by the mux 1484 of the other core 1410. Depending on how the device configuration logic configures the mux 1486, mux 1486 is configured to output one of these two inputs downstream to the PMA transmitter 1427.

Generally, the muxes 1482-1486 may be configured to switch between a MAC block 1435 receiving data from and/or sending data to its own SerDes lane 1425 and the SerDes lane 1425 of the other core 1410. For example, in the default configuration, where no data is routed to the other core 1410, core 1410a would be configured as follows. PMA receiver 1426a's data would be selected by mux 1484a and outputted to the MAC block 1435a. The data outputted downstream by MAC block 1435a would be selected by mux 1486a and directed to PMA transmitter 1427a. Mux 1482a would be inactive. Core 1410b would be similarly configured.

As another example, if core 1410a were core 510a from FIG. 6, and core 1410b were core 510b from FIG. 6, the muxes 1482-1486 would be configured as follows. The data outputted by PMA receiver 1426a would be selected by mux 1482a and outputted to mux 1484b. Mux 1484b would select this data and output it to MAC block 1435b. The data from MAC block 1435b would then be outputted to and selected by mux 1482b. Mux 1482b would then send this data to mux 1486a, which would select the data and forward it on to PMA transmitter 1427a. The remaining muxes would be inactive, as would MAC block 1425a and SerDes lane 1425b.

As yet another example, if core 1410a were core 510a from FIG. 7, and core 1410b were core 510b from FIG. 7, the muxes 1482-1486 would be configured as follows. The data outputted by PMA receiver 1426a would be selected by mux 1482a and outputted to mux 1484b. Mux 1484b would select this data and output it to MAC block 1435b. The data from MAC block 1435a would then be outputted to and selected by mux 1486a, which would select the data and forward it on to PMA transmitter 1427a. The remaining muxes would be inactive, as would SerDes lane 1425b.

As yet another example, if core 1410a were core 510a from FIG. 8, and core 1410b were core 510b from FIG. 8, the muxes 1482-1486 would be configured as follows. PMA receiver 1426a's data would be selected by mux 1484a and outputted to the MAC block 1435a. The data from MAC block 1435b would then be outputted to and selected by mux 1482b. Mux 1482b would then send this data to mux 1486a, which would select the data and forward it on to PMA transmitter 1427a. The remaining muxes would be inactive, as would SerDes lane 1425b.

FIG. 14 illustrates but one possible arrangement of auxiliary wiring for providing the functionality described herein. Other arrangements may include fewer or additional elements in varying arrangements.

For simplification, only one SerDes lane 1425 and one MAC block 1435 are depicted. However, each core 1410 may have a plurality of SerDes lanes 1425 and a plurality of MAC blocks 1435. The wiring and muxes 1482-1486 depicted in FIG. 14 may be repeated for each channel of wiring between one of these MAC blocks 1435 and one of these SerDes lanes 1425.

2.10. Example Ingress and Egress Blocks

Figure 15:
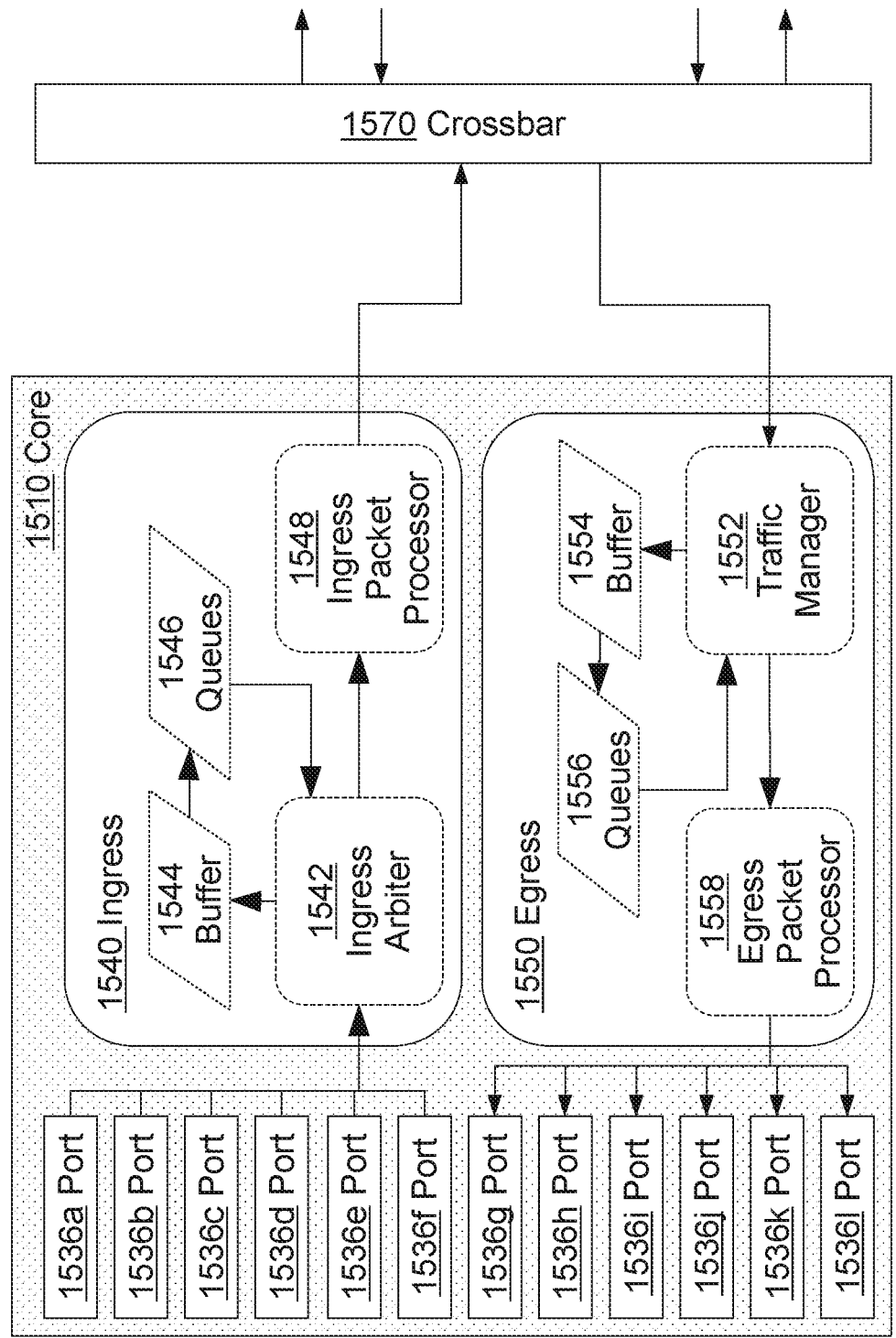
FIG. 15 illustrates example components of an ingress block and egress block of a core.

FIG. 15 illustrates example components of an ingress block 1540 and egress block 1550 of a core 1510, according to an embodiment. Ingress block 1540 is one example implementation of ingress block 540, while egress block 1550 is an example implementation of egress block 550, though it will be appreciated that ingress block 540 and egress block 550 may in other embodiments be implemented without the specific details of FIG. 15. The components depicted in FIG. 15 may be implemented by any combination of logics in one or more ASICs, FPGA, or other circuitry.

For simplification, the traffic managers, packet processors, and other components are on occasion described herein as acting upon or with respect to a data unit, when in fact only a portion of the data unit may be sent to or be otherwise available to the component. For instance, a packet processor may be said to process a data unit, when in fact only the data unit control portion is available to the packet processor. In such contexts, it will be understood that the information about the data unit that is actually available to the component is a representation of the data unit to that component. Any actions described herein as having been taken by the component on or with respect to the data unit may occur with respect to the representation of the data unit, and not necessarily the complete data unit.

Ingress Block

Ingress block 1540 includes an ingress arbiter 1542. An ingress arbiter 1542 is configured to receive data units from ingress ports 1536*a-f*, such as provided by one or more MAC blocks of an interface controller block. Ingress arbiter 1542 buffers these data units as they are received in a buffer 1544, which may be implemented using any suitable type of memory. In an embodiment, buffer 1544 may be one type of resource shared between cores (e.g. as with buffer 1266).

Ingress arbiter 1542 is responsible for determining when data units are sent to downstream components, and in particular to an ingress packet processor 1548 that is coupled to the ingress arbiter 1542. In this respect, an ingress arbiter 1542 may be viewed as an ingress version of a traffic manager, as described with respect to the egress block 1550. Ingress arbiter 1542 utilizes constructs referred to as ingress queues 1546 to prioritize and schedule data units for processing by the ingress packet processor 1548. Data units may be associated with different queues 1546 for different reasons, such as originating from particular ingress queues 1546, being associated with certain traffic flows, being of a certain traffic type, and so forth. Optionally, ingress arbiter 1542 may drop certain data units for various reasons (e.g. rate control, buffer over-utilization, etc.) by removing them from the buffer 1544 before they can be processed, or even failing to place the data units in a buffer.

Ingress packet processor 1548 performs forwarding tasks such as resolving the data unit destination, adding or removing header fields, and so forth. For instance, the ingress packet processor 1548 may be responsible for generating control information that instructs downstream components such as a crossbar or egress block 1550, how to handle a data unit (e.g. one or more destinations resolved using forwarding logic, instructions to clone or copy a data unit, etc.). This control information may either be inserted into the data unit, or be conveyed along with the data unit as sideband information.

In an embodiment, the ingress packet processor 1548 need not process the entire data unit, but may rather process only the start-of-packet portion of the data unit (e.g. the first cell, the packet header, etc.). The control information may subsequently be merged with the data unit via merge block prior to leaving the ingress block 1540.

In an embodiment, there may be one or more ingress packet processors 1548, and each ingress packet processor 1548 may be assigned to a different set of ingress queues 1546.

After a data unit has been processed, the data unit may then be released from the buffer 1544 and associated queue 1546, and transmitted to the crossbar 1570.

Egress Block

Egress block 1550 includes a traffic manager 1552. The traffic manager 1552 receives data units from the crossbar 1570 and places those data units in an egress buffer 1554. Egress buffer 1554 may be implemented using any suitable type of memory, and is another example of a resource that may be shared between cores (e.g. as with buffer 1266).

The traffic manager 1552 further places each data unit in one or more egress queues 1556 through a process referred to as linking or enqueueing. Each egress queue 156 may be associated with data units having different data unit attributes, such as traffic flow identifiers, egress ports, traffic classes, and so forth. The traffic manager 1552 may determine the foregoing information for a data unit by analyzing it directly, and/or from control information that accompanies the data unit. In an embodiment, there may be one or more egress queues 1556 per egress port 1536*g*-1, and/or per egress packet processor 1558. The traffic manager 1552 includes scheduling logic that, based on the egress queues 1556, determines when the egress packet processor 1558 should process each buffered data unit. Optionally, the traffic manager 1552 may drop a data unit for various reasons, as with the ingress arbiter 1542.

When the traffic manager 1552 determines it is time to send a data unit to the egress packet processor 1552, the data unit is read and removed from the buffer 1554. The egress packet processor 1558 receives that data unit, or at least the start-of-packet portion, and performs a set of actions or edits (e.g. as indicated by control information for the data unit), implements flow control and/or other policies, performs statistical or debugging operations, and so forth.

In an embodiment, there may be one or more egress packet processors 1558, and each egress packet processor 1558 may be assigned to a different set of egress queues 1556 and/or egress ports 1536*g-l*.

After a data unit has been processed, the data unit may then be transmitted to its destination egress port 1536*g*-1, potentially via one or more intermediate components such as an egress arbiter. Egress ports 1536*g*-1 may correspond to ingress ports 1526*a-f*, or may be separate interfaces, depending on the embodiment. Note that there may be any number of ports 1536, including more or fewer than depicted in FIG. 15.

3.0. Functional Overview

Example method flows for configuring and utilizing network chips such as described above are not presented. In an embodiment, each of the processes described in connection with the functional blocks described below may be implemented using one or more integrated circuits, logic components, computer programs, other software elements, and/or digital logic in any of a general-purpose computer or a special-purpose computer, while performing data retrieval, transformation, and storage operations that involve interacting with and transforming the physical state of memory of the computer.

3.1. Data Unit Handling Flow

Figure 16:
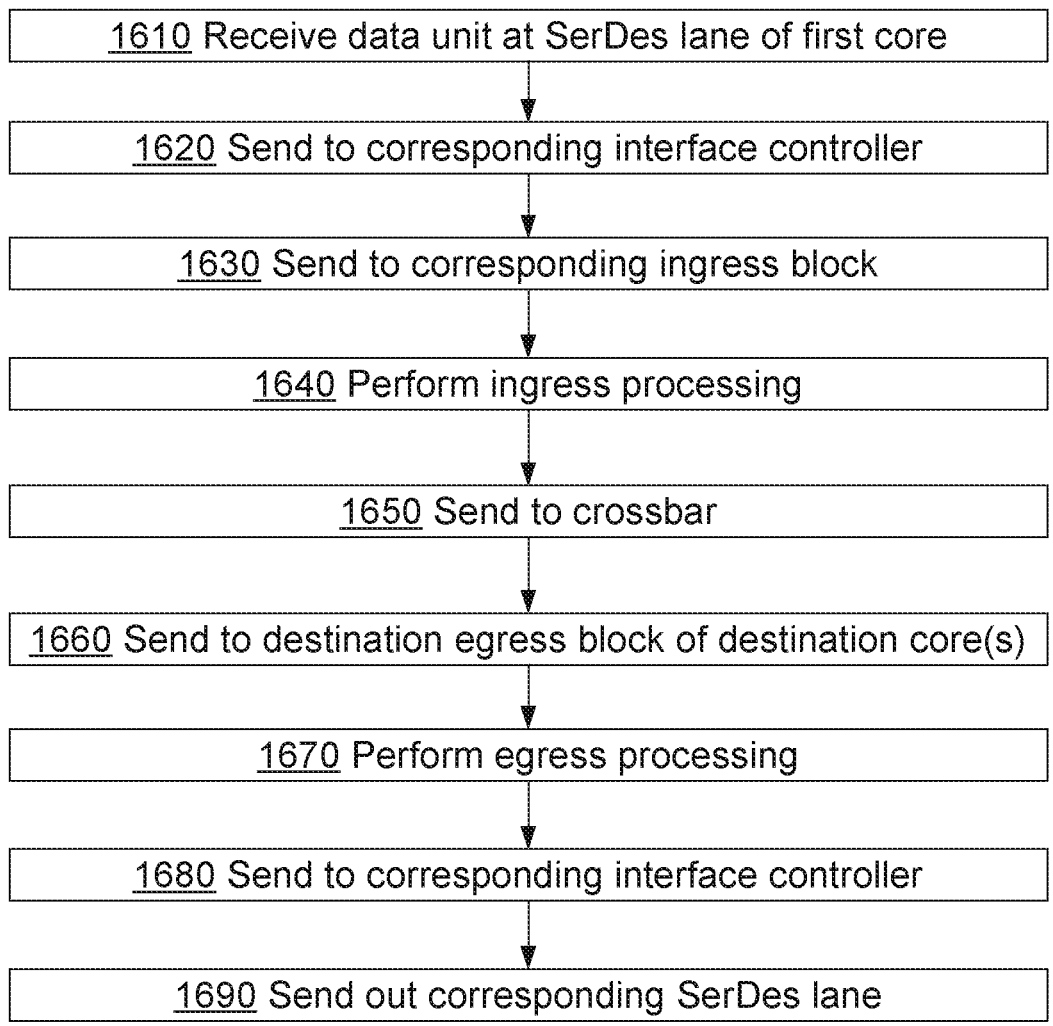
FIG. 16 illustrates an example flow for handling a data unit using a network chip such as described herein.

FIG. 16 illustrates an example flow 1600 for handling a data unit using a network chip such as described herein, according to an embodiment. For instance, flow 1600 may be utilized by a series of components in one or more physical cores 510 of chip 500 or 1000 to implement packet-switching on a data unit as the data unit traverses the chip on a path through a network, such as network 100. Of course, flow 1600 may be utilized in a variety of other contexts as well, with or without specific details of the various embodiments described above.

Block 1610 comprises receiving a data unit at a SerDes lane (or other type of I/O lane) of a first core of the implementing chip. The data unit may receive the data unit via one or more signals encoded in a variety of manners, such as PAM4, 64b/66b, NRZ, etc. Block 1610 may thus comprise decoding the signal that carries the data unit. Block 1610 may further comprise, or be followed by, descrambling signal(s), aligning signals, deskewing signals, and/or other processing steps common to physical layer processing of a network communications. In an embodiment, the data unit is interleaved with data from a number of other data units, and block 1610 may comprise deserializing a signal to produce parallel streams of data units.

Note that the SerDes lane itself may not necessarily be aware that the signals carry the data unit, or even its constituent subunits, and may instead only be aware of lower level network structures that carry various portions of data from the data unit.

Block 1620 comprises sending the data unit to a corresponding interface controller block. In default configurations of the chip, the corresponding interface controller block would be in the same physical first core as the SerDes lane in block 1610. However, in various embodiments described herein, the corresponding interface controller is not necessarily within the first core, if the device has been configured to route data around the ingress block of the first core. Rather, the SerDes lane may be configured to send the data unit via auxiliary wiring to the interface controller block of another core, as indicated by a device profile.

The interface controller block may perform various processing tasks such as error checking, assembling cells/frames from the data, and other tasks common to data layer processing of network traffic. Moreover, in an embodiment, certain of the foregoing acts mentioned in block 1510 may be performed in an interface controller block.

Block 1630 comprises sending the data unit to a corresponding ingress block. In many of the embodiments described herein, the corresponding ingress block is the ingress block coupled directly to the interface controller block of block 1620. However, in at least some embodiments, auxiliary wiring may be deployed in a different location, such that the interface controller block may send the data unit to the corresponding ingress block via the auxiliary wiring. Hence, the corresponding ingress block should be understood to be the ingress block that the device profile indicates should handle data units from the Serdes block of the first core, wherever that ingress block may be.

Block 1640 comprises performing ingress processing, including determining a destination for the data unit and any of a variety of other example ingress processing tasks described herein, depending on the embodiment. In an embodiment, block 1640 may comprise steps such as buffering the data unit in an ingress buffer, looking up a destination for the data unit in a forwarding table, processing that data unit with an ingress packet processor, generating control information, and so forth.

Block 1650 comprises sending the data unit to a crossbar, such as crossbar 570. The crossbar is an interconnect between multiple cores, including the first core and at least one other core. The crossbar is configured to input data units from ingress blocks in each connected core, and outputs the data units to destination egress blocks in potentially different cores.

Block 1660 comprises sending the data unit to an egress block of a destination core. The destination core may be indicated by the data unit itself, or accompanying control data or other metadata. Depending on how the device profile configures the chip, the destination core for the data unit may not necessarily include the destination SerDes lane for the data unit (e.g. if an egress block in another core is being used in place of the egress block in the core where the destination SerDes lane resides). In an embodiment, to account for such a discrepancy, the destination may have been expressed in terms of a logical core identifier, and block 1660 may thus comprise converting the logical core identifier of the destination to a physical core identifier, so that the crossbar can identify the physical destination of the data unit. However, such translation may have instead been performed in block 1640 or 1650.

In an embodiment, if the destination core and the first core are the same physical core, blocks 1650 might be skipped, and block 1660 may be performed via a direct interface between the ingress block and egress block. However, other embodiments may lack such an interface.

Block 1670 comprises performing egress processing of the data unit. The egress processing may comprise any of a variety of actions, depending on the embodiment, such as implementing flow control or other policies, as described elsewhere herein. In an embodiment, block 1670 may include buffering the data unit, processing the data unit with an egress packet processor, and so forth.

Block 1680 comprises sending the data unit to the corresponding interface controller for its destination. In most configurations explored herein, this is the interface controller block in the same core as, and directly connected to, the egress block of block 1660. However, other embodiments with different configurations of auxiliary wiring may allow for mapping a different interface controller to the data unit's destination.

Block 1690 comprises sending the data unit to the destination SerDes lane (or other type of I/O lane). Under default configurations, the destination SerDes lane is in the same core as, and directly connected to, the interface controller block from block 1680. However, in the event the egress block of block 1670 was processing the data unit on behalf of another core whose egress block was inactive, block 1690 may comprise sending the data unit to the SerDes block of the other core via auxiliary wiring.

In either event, the corresponding interface controller and SerDes lane will perform, essentially, the opposite processing from that performed in blocks 1620 and 1610, such as encapsulating the data unit in lower level network data structures, encoding those structures, serializing those structures along with other data, and so forth. The resulting data unit is sent back out to the network via signals over the channel coupled to the SerDes lane.

Flow 1600 illustrates but one flow for handling a data unit using a network chip such as described herein. Other flows may include additional or fewer steps, in varying arrangements. In an embodiment, not all data units received by the chip will be processed in this manner. For instance, some data units may be dropped at various steps in flow 1600, or diverted to logging or debugging operations.

Flow 1600 may be repeated any number of times, potentially with at least partial overlap between various iterations. These repetitions may be performed by the same components as in other iterations, or by different sets of components in other physical cores, depending on the destination of the data unit involved and the device configuration.

3.2. Programming a Device Profile

Figure 17:
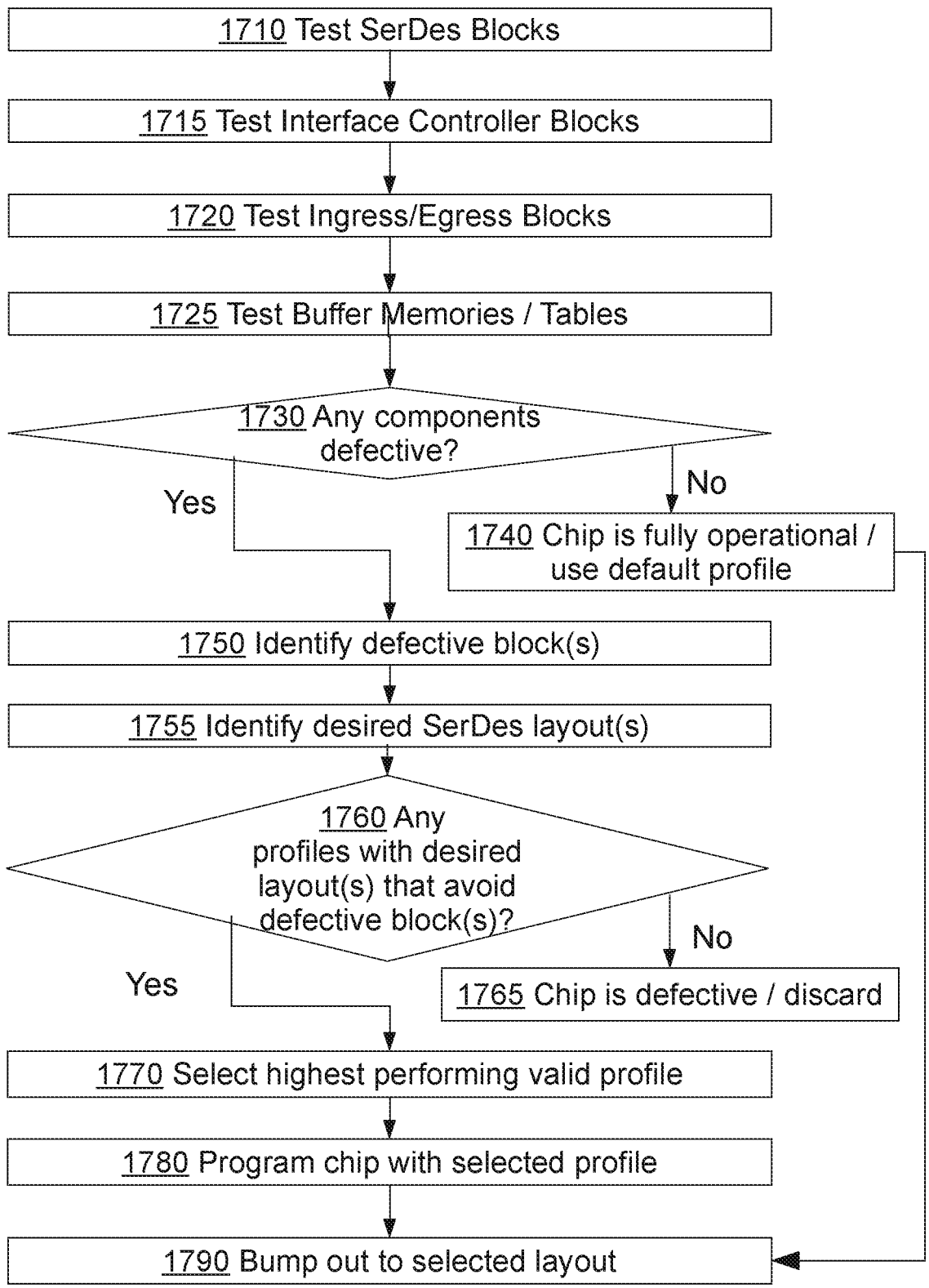
FIG. 17 illustrates an example flow for programming a multi-core network chip.

FIG. 17 illustrates an example flow 1700 for programming a multi-core network chip, according to an embodiment. Flow 1700 may be utilized to determine a device profile for use by device configuration logic, and program a chip such as chip 500 or 1000 with that profile. Flow 1700 may be performed by human operators and/or automated processes that test the chip using various testing equipment. In an embodiment, flow 1700 is performed at some time between fabricating a chip and integrating the chip into a system. However, flow 1700 may also or instead be performed at other times, such as by a network administrator performing an in-field evaluation of the performance of a network device.

Blocks 1710-1725 comprise testing various components of the chip, such as of chip 500 or 1000, or any other multi-core chip that utilizes the described techniques. These components include the SerDes blocks (block 1710), the interface controller blocks (block 1715), the packet-switching logic—or more particularly the ingress blocks and egress blocks—(block 1720), and the buffer memories and forwarding tables (block 1725). The testing may include any known testing procedures, from simple power-on tests to elaborate simulated network loads. Not all of the foregoing components need to be tested, depending on the embodiment.

Block 1730 comprises determining whether any of the tested components are defective. If not, then in block 1740 the chip is marked as being fully operational, and can be programmed with a fully operational profile (or any other desired profile) if that profile is not already the default profile. Flow 1700 then skips to block 1790 to bump out all of the SerDes lanes of the chip (or any other desired layout).

If any tested component is defective, then flow 1700 proceeds to block 1750, which comprises identifying the set of defective blocks. Block 1755 then comprises identifying the desired SerDes layout or layouts, if any. For instance, in some embodiments, it might be preferred that the desired SerDes layout for a non-fully-functional chip be to bump out Serdes lanes at opposite ends of the chip. There may be a backup preferences in some embodiments if the first preference is not possible, or there may be a single desired layout. In some cases, the desired layout may be a function of the number of logical cores that can possibly be formed from the working components of the chip. For instance, a certain layout might be preferred if six logical cores are possible from an eight-core chip, but a different layout might be preferred if only four logical cores are possible.

Block 1760 comprises determining whether there are any valid device profiles with the desired layout(s) from block 1755 that avoid the defective blocks identified in block 1750. For instance, there may be a database or list of all possible device profiles, and the set of non-defective device components may be compared to the list of active components in each of these profiles. The SerDes layouts for any matching profiles may then be compared to the desired layouts.

If no matching profile with a desired layout is found, the chip may be considered defective and discarded in block 1765. On the other hand, if one or more valid profiles are found, then in block 1770 those profiles may be scored (e.g. based on various criteria such layout preferences, and, potentially, performance metrics for the cores used by those profiles). The highest performing profile (or in some cases a random profile) may be selected.

Block 1780 comprises programming the chip with the selected profile. This may comprise, for instance, writing to a read-only memory ("ROM") or other persistent memory of the chip.

Block 1790 comprises bumping the chip out to the SerDes layout associated with the selected profile. This may comprise, for instance, forming an interconnect between the chip's die and the chip's packaging, between the chip itself and external circuitry on which the chip is mounted, etc. In an embodiment, block 1790 need not be performed by the same entity that performs the rest of flow 1700. Rather, a chip manufacturer may perform the bulk of flow 1700 and then send instructions to a systems integrator as to which SerDes lanes should be bumped out for the chip.

In an embodiment, chips matching a specific configuration trait (e.g. number of cores and/or active lanes, layout, etc.) may be binned together and sold under a particular model and/or brand. For instance, fully-functioning eight-core chips may be marketed to a certain type of systems integrator at a first price point, whereas versions of that same chip that have a four-working-core profile may be marketed to a different type of systems integrator at a lower price point.

Flow 1700 is but one example method flow for programming a multi-network chip with a device profile. Other flows may include fewer and/or additional steps in varying arrangements.

In yet other embodiments, the management logic of a chip may perform a flow similar to flow 1700 as part of a periodic or user-requested chip self-test and optimization process. The management logic may select a new profile that takes into account performance issues or new defects that have developed in the field, and may not have been apparent in the initial chip testing. For instance, a memory in a certain buffer may have gone bad, and the management logic may be configured to generate a new device profile that routes around an ingress block that uses that buffer (potentially at a decreased bandwidth, of course). The management logic would obviously not have the flexibility to bump out a selected SerDes layout, but may selectively disable a SerDes block that is defective or underperforming. Device interfacing logic may then provide an indication to a network administrator as to which corresponding physical ports are bad and should be disconnected.

3.3. Configuring a Chip with a Device Profile

Figure 18:
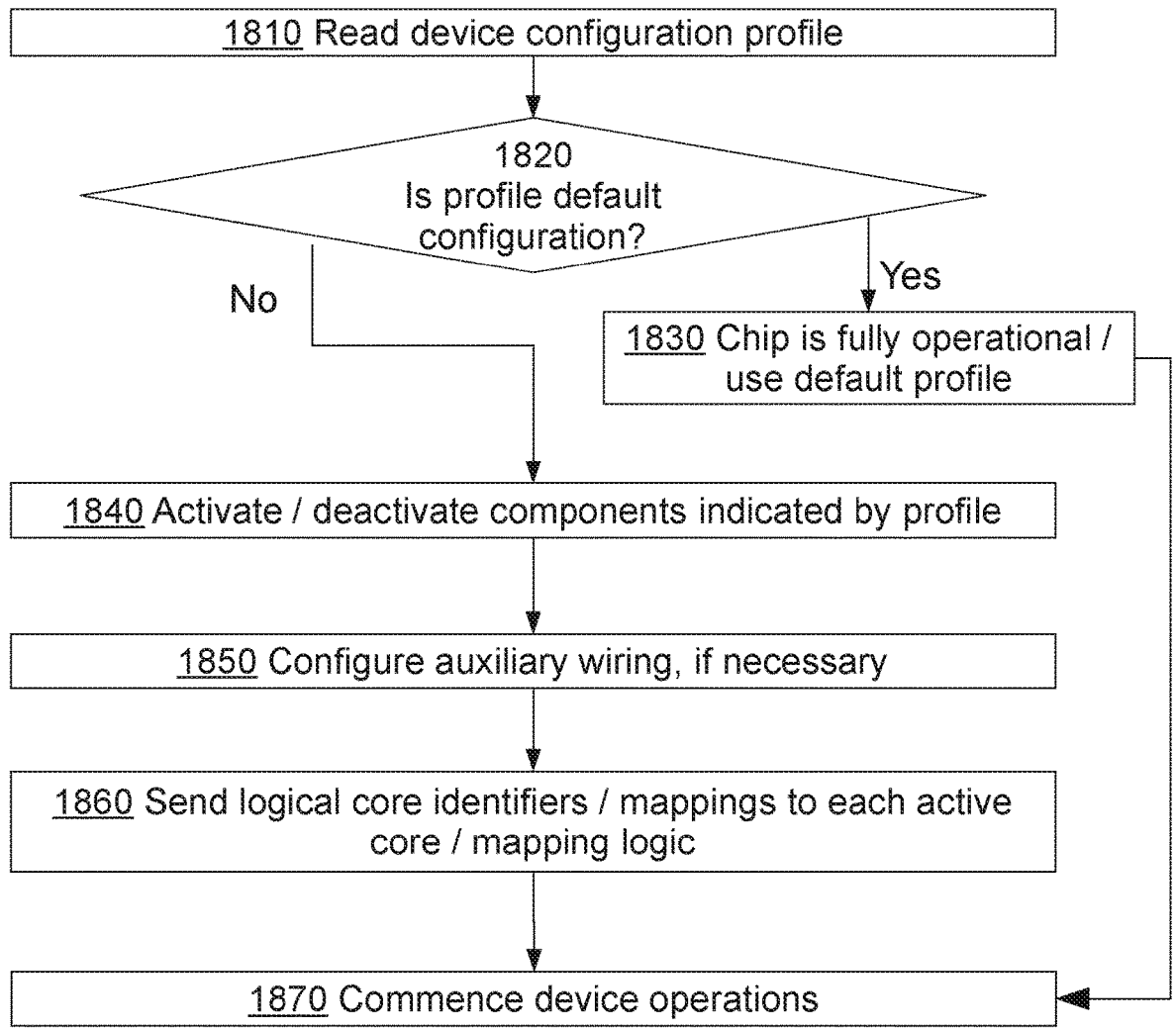
FIG. 18 illustrates an example flow for configuring a chip with a device profile.

FIG. 18 illustrates an example flow 1800 for configuring a chip with a device profile, such as programmed into the chip via flow 1700 or similar flows, according to an embodiment. Flow 1800 may be performed, for instance, when the chip is initially powered on, in response to a reboot or reset operation, in response to a reconfiguration request, and so forth. To avoid traffic loss, flow 1800 is generally not performed during normal operation of the chip.

Block 1810 comprises reading the device profile from a memory in which it was written. For instance, device configuration logic in a management block may read the device profile from a persistent memory to which it was written.

Block 1820 comprises determining if the profile is a default configuration profile. In an embodiment, if no device profile is found, then a default configuration profile may be assumed. In any event, if the profile is a default configuration profile, the chip is fully operational and flow 1800 may skip to block 1870 for commencement of normal device operations (after any other booting, initialization, or configuration tasks are performed).

If the profile is not the default profile, then block 1840 comprises deactivating any component indicated by the profile to be inactive. This may comprise, for instance, sending a signal to the component indicating that the component is inactive, failing to power the component, or even simply rerouting around the component (per block 1850) in some embodiments.

Block 1850 comprises configuring the auxiliary wiring, if necessary. This may comprise, for instance, sending signals to muxes or other components configured to redirect intra-core data transmissions, such as between a core's SerDes block and interface controller, to another core. Examples of such wiring configurations are described, without limitation, in other sections.

Block 1860 comprises sending logical core identifiers and mapping information indicated by the device profile to each active core, or to mapping logic coupled thereto. This permits each core to first recognize its own logical core identifier, and second translate between logical and physical core identifiers, as described in other sections.

Finally, block 1870 comprises commencing device operations. For instance, the device may begin receiving and handling data units per flow 1600.

Flow 1800 illustrates but one manner for configuring a chip with a device profile in accordance to the described techniques. Oher flows may include fewer and/or additional steps in varying arrangements.

4.0. Example Embodiments

Examples of some embodiments are represented, without limitation, as follows:

According to an embodiment, a network apparatus comprises: a plurality of cores, including at least a first core and a second core, each core of the cores including: a Serializer/DeSerializer ("SerDes") block comprising SerDes lanes; an ingress block coupled to the SerDes block on input and coupled to a crossbar on output; and an egress block coupled to the crossbar on input and coupled to the SerDes block on output; the crossbar, configured to transfer data between the cores; auxiliary wiring between the first core and the second core; device configuration logic configured to, based on a configuration profile indicating that one or both of the ingress block and the egress block of the first core are inactive, cause one or both of: the ingress block of the second core to receive data from the SerDes block of the first core via the auxiliary wiring; or the SerDes block of the first core to receive data from the egress block of the second core via the auxiliary wiring.

In an embodiment, each core of the cores further includes an interface control block via which the ingress block and egress block are coupled to the SerDes block; wherein the auxiliary wiring couples the SerDes block of the first core to the interface control block of the second core.

In an embodiment, the interface control includes Media Access Control ("MAC") logic; wherein the SerDes block includes Physical Medium Attachment ("PMA") receiver logic and PMA transmission logic; wherein the auxiliary wiring includes auxiliary muxing logics in each core of the first core and the second core, including: first muxing logic that selects between outputs of the PMA receiver logic and outputs of the MAC logic, and transmits the selected outputs to the other core of the first core and the second core; second muxing logic that selects between outputs of the MAC logic and outputs of the first muxing logic of the other core, and transmits the selected outputs to the PMA transmission logic; third muxing logic that selects between outputs of the PMA receiver logic and the first muxing logic of the other core, and transmits the selected outputs to MAC logic; wherein the device configuration logic is configured to cause transmission of data between the SerDes block of the first core and the ingress block or the egress block of the second core by adjusting signals to the auxiliary muxing logics of the first core and the second core.

In an embodiment, each core further comprises PCS logic deployed between the MAC logic and the PMA receiver logic and PMA transmission logic.

In an embodiment, responsive to the configuration profile indicating that the SerDes block of the second core is inactive, the device configuration logic is configured to cause the ingress block of the second core to receive data from the SerDes block of the first core via the auxiliary wiring, and the egress block of the second core to send data to the SerDes block of the first core via the auxiliary wiring, the SerDes block of the first core thereby replacing the SerDes block of the second core, the first core being otherwise inactive.

In an embodiment, the SerDes block of the first core is bumped out, and the SerDes block of the second core is not bumped out.

In an embodiment, responsive to the configuration profile indicating that the ingress block of the first core is inactive, the device configuration logic is configured to cause the ingress block of the second core to receive data from the SerDes block of the first core via the auxiliary wiring, the ingress block of the second core thereby replacing the ingress block of the first core, the second core being otherwise inactive.

In an embodiment, responsive to the configuration profile indicating that the egress block of the first core is inactive, the device configuration logic is configured to cause the egress block of the second core to send data to the SerDes block of the first core via the auxiliary wiring, the egress block of the second core thereby replacing the egress block of the first core, the second core being otherwise inactive.

In an embodiment, the inactive block is defective, wherein at least one block of the otherwise inactive core is also defective.

In an embodiment, the device configuration logic is configured to cause the ingress block of the second core to receive data from both the SerDes block of the first core and the SerDes block of the second core, and to cause the egress block of the second core to send data to both the SerDes block of the first core and the SerDes block of the second core, the SerDes block of the first core thereby doubling how many SerDes lanes are available to the second core, the first core being otherwise inactive.

In an embodiment, the plurality of cores includes at least four cores, wherein the auxiliary wiring is first auxiliary wiring, the apparatus further comprising auxiliary wiring interconnecting each core in the plurality of cores with two adjacent cores in the plurality of cores.

In an embodiment, the plurality of cores is exactly four physical cores, and the device configuration logic is configured to, responsive to the configuration profile indicating defects in three or more of the physical cores, cause data to be redirected between blocks of the physical cores via the auxiliary wiring to form at least two working logical cores.

In an embodiment, each of the cores has a physical core identifier, wherein the device configuration profile assigns each of the cores a logical core identifier, the ingress block and the egress block of each core further including forwarding logic configured to operate with respect to logical core identifiers, each of the cores further including mapping logic configured to translate between logical core identifiers and physical core identifiers when communicating with the crossbar.

In an embodiment, each core further includes at least one buffer memory utilized by forwarding logic within the ingress block and/or egress block of the core, wherein the core and is further coupled to the buffer memory of at least one other core, wherein the forwarding logic is configured to utilize the buffer memory of the other core in addition to its own buffer memory responsive to the configuration profile indicating that the forwarding logic of the other core is inactive.

In an embodiment, each core further includes at least one forwarding table utilized by forwarding logic within the ingress block and/or egress block of the core, wherein the core and is further coupled to the forwarding table of at least one other core, wherein the forwarding logic is configured to utilize the forwarding table of the other core in addition to its own forwarding table responsive to the configuration profile indicating that the forwarding logic of the other core is inactive.

In an embodiment, the apparatus further comprises a central processor block coupled to each of the cores, the central processor block comprising logic for managing operation of the apparatus, the logic using logical core identifiers assigned to the cores by the configuration profile, the central processor block including mapping logic configured to translate between and physical core identifiers of the cores when communicating with the cores.

In an embodiment, for each core, the SerDes block comprises serial interfaces and parallel interfaces, the SerDes lanes configured to deserialize data moving from the serial interfaces to the parallel interfaces and to serialize data moving from the parallel interfaces to the serial interfaces; the ingress block and the egress blocks are coupled to the SerDes block indirectly via paths that include the parallel interfaces.

In an embodiment, for each core, the ingress block is configured to perform ingress processing on data units the ingress block receives via an ingress input interface, the ingress input interface coupled to the SerDes block of the core via an interface control block, the interface control block further coupled by external wiring, including the auxiliary wiring, to the SerDes block of at least one other core, the device configuration logic configured to cause the interface control block to receive data from different SerDes blocks depending on the device configuration profile.

In an embodiment, for each core, the egress block is configured to perform egress processing on data units the egress block transmits via an egress output interface, the egress output interface coupled to the SerDes block of the core via an interface control block, the interface control block further coupled by external wiring, including the auxiliary wiring, to the SerDes block of at least one other core, the device configuration logic configured to cause the interface control block to send data to different SerDes blocks depending on the device configuration profile.

In an embodiment, for each core, the ingress block is configured to input data units, identify destination egress blocks for those data units, generate control information indicating the destination egress blocks to which the data units are to be sent, and transmit the data units with the control information to the crossbar; wherein the crossbar is configured to use the control information to identify destination egress blocks for the data units the crossbar receives from the ingress block of each core, and send the data units to the identified destination egress blocks; wherein, for each core, the egress block is configured to input data units received from the cross bar, identify destination ports for those data units, and send the data units to the destination ports via corresponding SerDes lanes.

In an embodiment, the ingress block comprises one or more ingress packet processors, wherein the egress block comprises one or more traffic managers and one or more egress packet processors.

In an embodiment, the auxiliary wiring is separate from the crossbar.

In an embodiment, the apparatus is a network chip, and wherein the ingress block and the egress block collectively implement Layer 3 switching logic.

According to an embodiment, a method comprises: integrating a network chip into a network device, the chip comprising: a plurality of cores, each core of the cores including: a Serializer/DeSerializer ("SerDes") block comprising SerDes lanes; an ingress block coupled to the SerDes block on input and coupled to a crossbar on output; and an egress block coupled to the crossbar on input and coupled to the SerDes block on output; the crossbar, configured to transfer data between the cores; auxiliary wiring interconnecting each core in the plurality of cores with at least one adjacent core in the plurality of cores; and device configuration logic configured to cause data to be redirected between blocks of the physical cores via the auxiliary wiring based on a configuration profile; bumping out the SerDes lanes of a first core of the plurality of cores to interfaces of the network device; programming the chip with a particular configuration profile that indicates to the device configuration logic to cause one or both of: the ingress block of a second core of the plurality of cores to receive data from the SerDes block of the first core via the auxiliary wiring; or the SerDes block of the first core to receive data from the egress block of the second core via the auxiliary wiring.

In an embodiment, the bumping comprises bumping out the SerDes lanes of the first core, but not of the second core.

In an embodiment, the method further comprises performing said bumping and programming responsive to determining that both the SerDes block of the second core is defective and at least one block of the first core defective; wherein the particular configuration profile further indicates to the device configuration logic to cause the ingress block of the second core to receive data from the SerDes block of the first core via the auxiliary wiring, and the egress block of the second core to send data to the SerDes block of the first core via the auxiliary wiring.

In an embodiment, the method further comprises: performing said programming responsive to determining that ingress block of the first core is defective; wherein the particular configuration profile further indicates to the device configuration logic to cause the ingress block of the second core to receive data from the SerDes block of the first core via the auxiliary wiring, the ingress block of the second core thereby replacing the ingress block of the first core, the second core being otherwise inactive.

In an embodiment, the method further comprises performing said programming responsive to determining that egress block of the first core is defective; wherein the particular configuration profile further indicates to the device configuration logic to cause the egress block of the second core to send data to the SerDes block of the first core via the auxiliary wiring, the egress block of the second core thereby replacing the egress block of the first core, the second core being otherwise inactive.

In an embodiment, the method further comprises bumping out the SerDes lanes of the second core of the plurality of cores to other interfaces of the network device; wherein the particular configuration profile further indicates to the device configuration logic to cause the ingress block of the second core to receive data from both the SerDes block of the first core and the SerDes block of the second core, and to cause the egress block of the second core to send data to both the SerDes block of the first core and the SerDes block of the second core, the SerDes block of the first core thereby doubling how many SerDes lanes are available to the second core, the first core being otherwise inactive.

According to an embodiment, a network apparatus comprises: a plurality of cores, including at least a first core and a second core, each core of the cores including: one or more memories configured to store a forwarding table and a buffer; traffic management logic configured to store data units awaiting processing in the buffer; forwarding logic configured to identify destinations for data units using the forwarding table; interfaces configured to receive the data units and to send the data units to the identified destinations; a crossbar, configured to transfer data units between the cores; auxiliary wiring between the first core and the second core; device configuration logic configured to, based on a configuration profile indicating that the first core are inactive, cause one or both of: the traffic management logic of the second core utilizing the buffer of the first core in addition to the buffer of the second core; or the forwarding logic to use the forwarding table of the first core in addition to the forwarding table of the second core.

Yet other example embodiments are described in other sections herein.

5.0. Implementation Mechanism—Hardware Overview

According to one embodiment, the techniques described herein are implemented by one or more special-purpose computing devices. The special-purpose computing devices may be network devices, desktop computer systems, portable computer systems, handheld devices, or any other device that incorporates hard-wired and/or program logic to implement the techniques. The special-purpose computing devices may be hard-wired to perform the techniques, or may include digital electronic devices such as one or more application-specific integrated circuits (ASICs) or field programmable gate arrays (FPGAs) that are persistently programmed to perform the techniques. Such special-purpose computing devices may also combine custom hard-wired logic, ASICs, FPGAs, or other circuitry with custom programming to accomplish the techniques.

Though certain foregoing techniques are described with respect to a hardware implementation, which provides a number of advantages in certain embodiments, it will also be recognized that, in other embodiments, the foregoing techniques may still provide certain advantages when performed partially or wholly in software. Accordingly, in such an embodiment, a suitable implementing apparatus comprises a general-purpose hardware processor and is configured to perform any of the foregoing methods by executing program instructions in firmware, memory, other storage, or a combination thereof.

Figure 19:
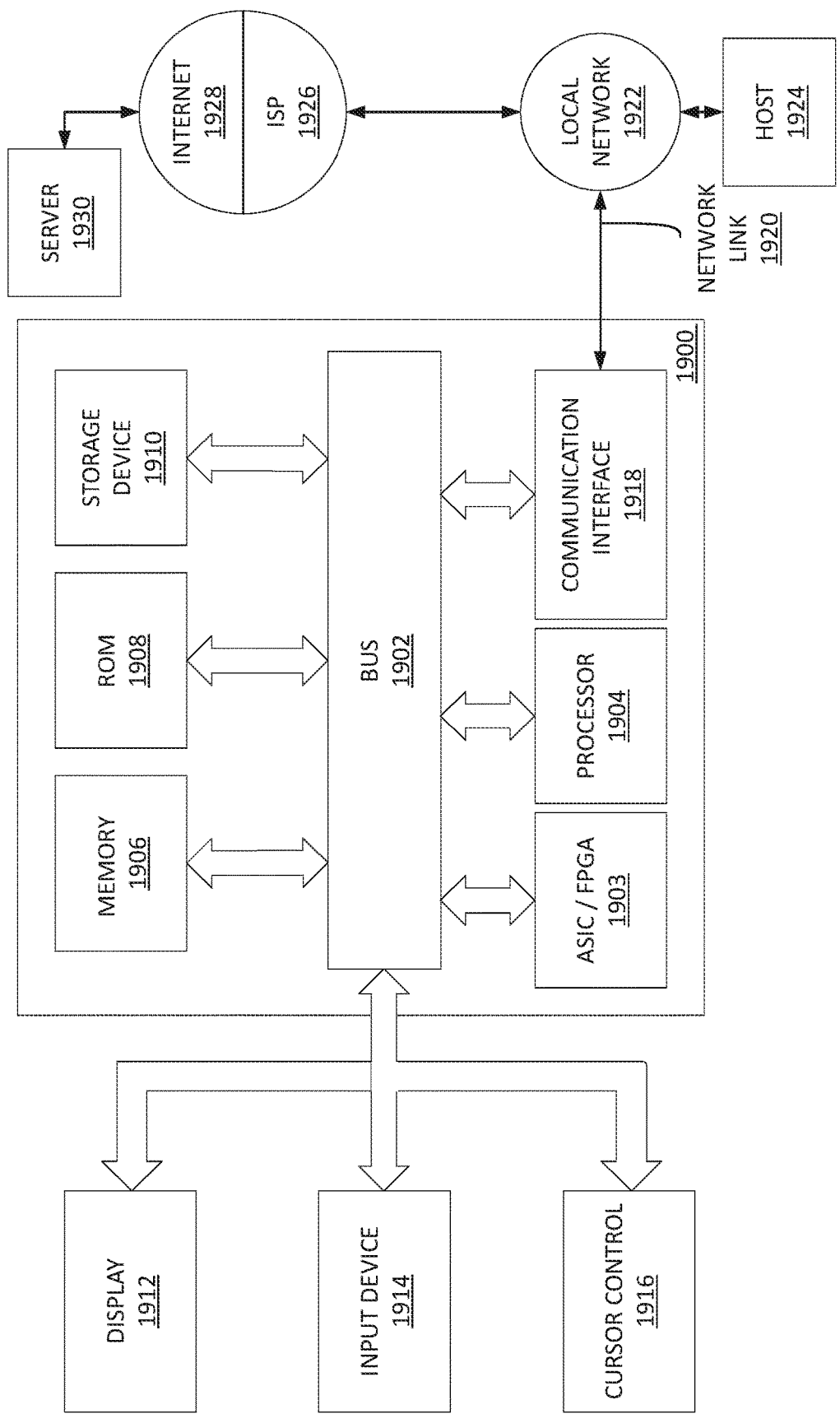
FIG. 19 is a block diagram that illustrates an example computer system that may be utilized in implementing the above-described techniques.

FIG. 19 is a block diagram that illustrates an example computer system 1900 that may be utilized in implementing the above-described techniques, according to an embodiment. Computer system 1900 may be, for example, a desktop computing device, laptop computing device, tablet, smartphone, server appliance, computing mainframe, multimedia device, handheld device, networking apparatus, or any other suitable device. In an embodiment, FIG. 19 constitutes a different view of the devices and systems described in previous sections.

Computer system 1900 may include one or more ASICs, FPGAs, or other specialized circuitry 1903 for implementing program logic as described herein. For example, circuitry 1903 may include fixed and/or configurable hardware logic blocks for implementing some or all of the described techniques, input/output (I/O) blocks, hardware registers or other embedded memory resources such as random-access memory (RAM) for storing various data, and so forth. The logic blocks may include, for example, arrangements of logic gates, flip-flops, multiplexers, and so forth, configured to generate an output signals based on logic operations performed on input signals.

Additionally, and/or instead, computer system 1900 may include one or more hardware processors 1904 configured to execute software-based instructions. Computer system 1900 may also include one or more busses 1902 or other communication mechanism for communicating information. Busses 1902 may include various internal and/or external components, including, without limitation, internal processor or memory busses, a Serial ATA bus, a PCI Express bus, a Universal Serial Bus, a HyperTransport bus, an InfiniBand bus, and/or any other suitable wired or wireless communication channel.

Computer system 1900 also includes one or more memories 1906, such as a RAM, hardware registers, or other dynamic or volatile storage device for storing data units to be processed by the one or more ASICs, FPGAs, or other specialized circuitry 1903. Memory 1906 may also or instead be used for storing information and instructions to be executed by processor 1904. Memory 1906 may be directly connected or embedded within circuitry 1903 or a processor 1904. Or, memory 1906 may be coupled to and accessed via bus 1902. Memory 1906 also may be used for storing temporary variables, data units describing rules or policies, or other intermediate information during execution of program logic or instructions.

Computer system 1900 further includes one or more read only memories (ROM) 1908 or other static storage devices coupled to bus 1902 for storing static information and instructions for processor 1904. One or more storage devices 1910, such as a solid-state drive (SSD), magnetic disk, optical disk, or other suitable non-volatile storage device, may optionally be provided and coupled to bus 1902 for storing information and instructions.

A computer system 1900 may also include, in an embodiment, one or more communication interfaces 1918 coupled to bus 1902. A communication interface 1918 provides a data communication coupling, typically two-way, to a network link 1920 that is connected to a local network 1922. For example, a communication interface 1918 may be an integrated services digital network (ISDN) card, cable modem, satellite modem, or a modem to provide a data communication connection to a corresponding type of telephone line. As another example, the one or more communication interfaces 1918 may include a local area network (LAN) card to provide a data communication connection to a compatible LAN. As yet another example, the one or more communication interfaces 1918 may include a wireless network interface controller, such as an 1902.11-based controller, Bluetooth controller, Long Term Evolution (LTE) modem, and/or other types of wireless interfaces. In any such implementation, communication interface 1918 sends and receives electrical, electromagnetic, or optical signals that carry digital data streams representing various types of information.

Network link 1920 typically provides data communication through one or more networks to other data devices. For example, network link 1920 may provide a connection through local network 1922 to a host computer 1924 or to data equipment operated by a Service Provider 1926. Service Provider 1926, which may for example be an Internet Service Provider (ISP), in turn provides data communication services through a wide area network, such as the worldwide packet data communication network now commonly referred to as the "Internet" 1928. Local network 1922 and Internet 1928 both use electrical, electromagnetic or optical signals that carry digital data streams. The signals through the various networks and the signals on network link 1920 and through communication interface 1918, which carry the digital data to and from computer system 1900, are example forms of transmission media.

In an embodiment, computer system 1900 may send and receive data units through the network(s), network link 1920, and communication interface 1918. In some embodiments, this data may be data units that the computer system 1900 has been asked to process and, if necessary, redirect to other computer systems via a suitable network link 1920. In other embodiments, this data may be instructions for implementing various processes related to the described techniques. For instance, in the Internet example, a server 1930 might transmit a requested code for an application program through Internet 1928, ISP 1926, local network 1922 and communication interface 1918. The received code may be executed by processor 1904 as it is received, and/or stored in storage device 1910, or other non-volatile storage for later execution. As another example, information received via a network link 1920 may be interpreted and/or processed by a software component of the computer system 1900, such as a web browser, application, or server, which in turn issues instructions based thereon to a processor 1904, possibly via an operating system and/or other intermediate layers of software components.

Computer system 1900 may optionally be coupled via bus 1902 to one or more displays 1912 for presenting information to a computer user. For instance, computer system 1900 may be connected via a High-Definition Multimedia Interface (HDMI) cable or other suitable cabling to a Liquid Crystal Display (LCD) monitor, and/or via a wireless connection such as peer-to-peer Wi-Fi Direct connection to a Light-Emitting Diode (LED) television. Other examples of suitable types of displays 1912 may include, without limitation, plasma display devices, projectors, cathode ray tube (CRT) monitors, electronic paper, virtual reality headsets, braille terminal, and/or any other suitable device for outputting information to a computer user. In an embodiment, any suitable type of output device, such as, for instance, an audio speaker or printer, may be utilized instead of a display 1912.

One or more input devices 1914 are optionally coupled to bus 1902 for communicating information and command selections to processor 1904. One example of an input device 1914 is a keyboard, including alphanumeric and other keys. Another type of user input device 1914 is cursor control 1916, such as a mouse, a trackball, or cursor direction keys for communicating direction information and command selections to processor 1904 and for controlling cursor movement on display 1912. This input device typically has two degrees of freedom in two axes, a first axis (e.g., x) and a second axis (e.g., y), that allows the device to specify positions in a plane. Yet other examples of suitable input devices 1914 include a touch-screen panel affixed to a display 1912, cameras, microphones, accelerometers, motion detectors, and/or other sensors. In an embodiment, a network-based input device 1914 may be utilized. In such an embodiment, user input and/or other information or commands may be relayed via routers and/or switches on a Local Area Network (LAN) or other suitable shared network, or via a peer-to-peer network, from the input device 1914 to a network link 1920 on the computer system 1900.

As discussed, computer system 1900 may implement techniques described herein using customized hard-wired logic, one or more ASICs or FPGAs 1903, firmware and/or program logic, which in combination with the computer system causes or programs computer system 1900 to be a special-purpose machine. According to one embodiment, however, the techniques herein are performed by computer system 1900 in response to processor 1904 executing one or more sequences of one or more instructions contained in main memory 1906. Such instructions may be read into main memory 1906 from another storage medium, such as storage device 1910. Execution of the sequences of instructions contained in main memory 1906 causes processor 1904 to perform the process steps described herein.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 1910. Volatile media includes dynamic memory, such as main memory 1906. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 1902. Transmission media may also take the form of acoustic or light waves, such as those generated during radio-wave and infra-red data communications.

Various forms of media may be involved in carrying one or more sequences of one or more instructions to processor 1904 for execution. For example, the instructions may initially be carried on a magnetic disk or solid-state drive of a remote computer. The remote computer can load the instructions into its dynamic memory and use a modem to send the instructions over a network, such as a cable network or cellular network, as modulated signals. A modem local to computer system 1900 may receive the data on the network and demodulate the signal to decode the transmitted instructions. Appropriate circuitry may then place the data on bus 1902. Bus 1902 carries the data to main memory 1906, from which processor 1904 retrieves and executes the instructions. The instructions received by main memory 1906 may optionally be stored on storage device 1910 either before or after execution by processor 1904.

6.0. Extensions and Alternatives

As used herein, the terms "first," "second," "certain," and "particular" are used as naming conventions to distinguish components, data units, steps, objects, devices, or other items from each other, so that these items may be referenced after they have been introduced. Unless otherwise specified herein, the use of these terms does not imply an ordering, timing, or any other characteristic of the referenced items.

In the drawings, the various components are depicted as being communicatively coupled to various other components by arrows. These arrows illustrate only certain examples of information flows between the components. Unless otherwise indicated, neither the direction of the arrows nor the lack of arrow lines between certain components should be interpreted as indicating the existence or absence of communication between the certain components themselves. Indeed, each component may feature a suitable communication interface by which the component may become communicatively coupled to other components as needed to accomplish any of the functions described herein.

In the foregoing specification, embodiments of the inventive subject matter have been described with reference to numerous specific details that may vary from implementation to implementation. Thus, the sole and exclusive indicator of what is the inventive subject matter, and is intended to be the inventive subject matter, is the set of claims that issue from this application, in the specific form in which such claims issue, including any subsequent correction. In this regard, although specific claim dependencies are set out in the claims of this application, it is to be noted that the features of the dependent claims of this application may be combined as appropriate with the features of other dependent claims and with the features of the independent claims of this application, and not merely according to the specific dependencies recited in the set of claims. Moreover, although separate embodiments are discussed herein, any combination of embodiments and/or partial embodiments discussed herein may be combined to form further embodiments.

Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A network apparatus comprising:
   a plurality of cores, including at least a first core and a second core, each core of the cores comprising:
      a Serializer/DeSerializer ("SerDes") block comprising SerDes lanes;
      an ingress block coupled to the SerDes block on input and coupled to a crossbar on output; and
      an egress block coupled to the crossbar on input and coupled to the SerDes block on output;
   the crossbar, configured to transfer data between the cores;
   auxiliary wiring between the first core and the second core, the auxiliary wiring being separate from the crossbar; and
   device configuration logic configured to, based on a configuration profile indicating that one or both of the ingress block and the egress block of the first core are inactive, cause one or both of:
      the ingress block of the second core to receive data from the SerDes block of the first core via the auxiliary wiring; or
      the SerDes block of the first core to receive data from the egress block of the second core via the auxiliary wiring; and
   wherein each core of the plurality of cores has a physical core identifier, wherein the configuration profile assigns each core of the plurality of cores a logical core identifier, the ingress block and the egress block of each core further including forwarding logic configured to operate with respect to logical core identifiers, each core of the plurality of cores further including mapping logic configured to translate between logical core identifiers and physical core identifiers when communicating with the crossbar.

2. The apparatus of claim 1,
   wherein each core of the cores further includes an interface control block via which the ingress block and egress block are coupled to the SerDes block;
   wherein the auxiliary wiring couples the SerDes block of the first core to the interface control block of the second core.

3. The apparatus of claim 2,
   wherein the interface control includes Media Access Control ("MAC") logic;
   wherein the SerDes block includes Physical Medium Attachment ("PMA") receiver logic and PMA transmission logic;
   wherein the auxiliary wiring includes auxiliary muxing logics in each core of the first core and the second core, including:
      first muxing logic that selects between outputs of the PMA receiver logic and outputs of the MAC logic, and transmits the selected outputs to the other core of the first core and the second core;
      second muxing logic that selects between outputs of the MAC logic and outputs of the first muxing logic of the other core, and transmits the selected outputs to the PMA transmission logic;
      third muxing logic that selects between outputs of the PMA receiver logic and the first muxing logic of the other core, and transmits the selected outputs to MAC logic;
   wherein the device configuration logic is configured to cause transmission of data between the SerDes block of the first core and the ingress block or the egress block of the second core by adjusting signals to the auxiliary muxing logics of the first core and the second core.

4. The apparatus of claim 1, wherein, responsive to the configuration profile indicating that the SerDes block of the second core is inactive, the device configuration logic is configured to cause the ingress block of the second core to receive data from the SerDes block of the first core via the auxiliary wiring, and the egress block of the second core to send data to the SerDes block of the first core via the auxiliary wiring, the SerDes block of the first core thereby replacing the SerDes block of the second core, the first core being otherwise inactive.

5. The apparatus of claim 4, wherein the SerDes block of the first core is bumped out, and the SerDes block of the second core is not bumped out.

6. The apparatus of claim 1, wherein, responsive to the configuration profile indicating that the ingress block of the first core is inactive, the device configuration logic is configured to cause the ingress block of the second core to receive data from the SerDes block of the first core via the auxiliary wiring, the ingress block of the second core thereby replacing the ingress block of the first core, the second core being otherwise inactive.

7. The apparatus of claim 1, wherein, responsive to the configuration profile indicating that the egress block of the first core is inactive, the device configuration logic is configured to cause the egress block of the second core to send data to the SerDes block of the first core via the auxiliary wiring, the egress block of the second core thereby replacing the egress block of the first core, the second core being otherwise inactive.

8. The apparatus of claim 1, wherein the device configuration logic is configured to cause the ingress block of the second core to receive data from both the SerDes block of the first core and the SerDes block of the second core, and to cause the egress block of the second core to send data to both the SerDes block of the first core and the SerDes block of the second core, the SerDes block of the first core thereby doubling how many SerDes lanes are available to the second core, the first core being otherwise inactive.

9. The apparatus of claim 1, wherein the plurality of cores includes at least four cores, wherein the auxiliary wiring is first auxiliary wiring, the apparatus further comprising auxiliary wiring interconnecting each core in the plurality of cores with two adjacent cores in the plurality of cores.

10. The apparatus of claim 9, wherein the plurality of cores is exactly four physical cores, and the device configuration logic is configured to, responsive to the configuration profile indicating defects in three or more of the physical cores, cause data to be redirected between blocks of the physical cores via the auxiliary wiring to form at least two working logical cores.

11. The apparatus of claim 1, wherein each core further includes at least one buffer memory utilized by forwarding logic within the ingress block and/or egress block of the core, wherein the core and is further coupled to the buffer memory of at least one other core, wherein the forwarding logic is configured to utilize the buffer memory of the other core in addition to its own buffer memory responsive to the configuration profile indicating that the forwarding logic of the other core is inactive.

12. The apparatus of claim 1, wherein each core further includes at least one forwarding table utilized by forwarding logic within the ingress block and/or egress block of the core, wherein the core and is further coupled to the forwarding table of at least one other core, wherein the forwarding logic is configured to utilize the forwarding table of the other core in addition to its own forwarding table responsive to the configuration profile indicating that the forwarding logic of the other core is inactive.

13. The apparatus of claim 1, further comprising a central processor block coupled to each core of the plurality of cores, the central processor block comprising logic for managing operation of the apparatus, the logic using logical core identifiers assigned to the cores by the configuration profile, the central processor block including mapping logic configured to translate between and physical core identifiers of the cores when communicating with the cores.

14. A method comprising:
integrating a network chip into a network device, the chip comprising:
a plurality of cores, each core of the cores comprising:
a Serializer/DeSerializer ("SerDes") block comprising SerDes lanes;
an ingress block coupled to the SerDes block on input and coupled to a crossbar on output; and
an egress block coupled to the crossbar on input and coupled to the SerDes block on output;
the crossbar, configured to transfer data between the cores;
auxiliary wiring interconnecting each core in the plurality of cores with at least one adjacent core in the plurality of cores, the auxiliary wiring separate from the crossbar; and
device configuration logic configured to cause data to be redirected between blocks of the physical cores via the auxiliary wiring based on a configuration profile;
bumping out the SerDes lanes of a first core of the plurality of cores to interfaces of the network device; and
programming the chip with a particular configuration profile that indicates to the device configuration logic to cause one or both of:
the ingress block of a second core of the plurality of cores to receive data from the SerDes block of the first core via the auxiliary wiring; or
the SerDes block of the first core to receive data from the egress block of the second core via the auxiliary wiring; and
wherein each core of the plurality of cores has a physical core identifier, wherein the configuration profile assigns each core of the plurality of cores a logical core identifier, the ingress block and the egress block of each core further including forwarding logic configured to operate with respect to logical core identifiers, each core of the plurality of cores further including mapping logic configured to translate between logical core identifiers and physical core identifiers when communicating with the crossbar.

15. The method of claim 14, wherein the bumping comprises bumping out the SerDes lanes of the first core, but not of the second core.

16. The method of claim 15, further comprising:
performing said bumping and programming responsive to determining that both the SerDes block of the second core is defective and at least one block of the first core defective;
wherein the particular configuration profile further indicates to the device configuration logic to cause the ingress block of the second core to receive data from the SerDes block of the first core via the auxiliary wiring, and the egress block of the second core to send data to the SerDes block of the first core via the auxiliary wiring.

17. The method of claim 15, further comprising:
performing said programming responsive to determining that ingress block of the first core is defective;
wherein the particular configuration profile further indicates to the device configuration logic to cause the ingress block of the second core to receive data from the SerDes block of the first core via the auxiliary wiring, the ingress block of the second core thereby replacing the ingress block of the first core, the second core being otherwise inactive.

18. The method of claim 15, further comprising:
performing said programming responsive to determining that egress block of the first core is defective;
wherein the particular configuration profile further indicates to the device configuration logic to cause the egress block of the second core to send data to the SerDes block of the first core via the auxiliary wiring, the egress block of the second core thereby replacing the egress block of the first core, the second core being otherwise inactive.

19. The method of claim 14, further comprising:

bumping out the SerDes lanes of the second core of the plurality of cores to other interfaces of the network device;

wherein the particular configuration profile further indicates to the device configuration logic to cause the ingress block of the second core to receive data from both the SerDes block of the first core and the SerDes block of the second core, and to cause the egress block of the second core to send data to both the SerDes block of the first core and the SerDes block of the second core, the SerDes block of the first core thereby doubling how many SerDes lanes are available to the second core, the first core being otherwise inactive.

\* \* \* \* \*